United States Patent
Kim et al.

(10) Patent No.: US 11,302,381 B1
(45) Date of Patent: Apr. 12, 2022

(54) SUB WORD LINE DRIVER

(71) Applicant: Micron Technology, Inc., Boise, ID (US)

(72) Inventors: Tae H. Kim, Boise, ID (US); Brenton P. Van Leeuwen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/170,743

(22) Filed: Feb. 8, 2021

(51) Int. Cl.
*G11C 11/408* (2006.01)
*G11C 11/22* (2006.01)

(52) U.S. Cl.
CPC ........ *G11C 11/4085* (2013.01); *G11C 11/221* (2013.01); *G11C 11/2257* (2013.01); *G11C 11/2259* (2013.01); *G11C 11/4087* (2013.01)

(58) Field of Classification Search
CPC .............. G11C 11/4085; G11C 11/221; G11C 11/2257; G11C 11/2259; G11C 11/4087
See application file for complete search history.

(56) References Cited

U.S. PATENT DOCUMENTS

| | | | | |
|---|---|---|---|---|
| 7,177,226 B2* | 2/2007 | Lee | ........................... | G11C 8/08 365/230.06 |
| 8,072,835 B2* | 12/2011 | Kim | ......................... | G11C 8/08 365/230.06 |
| 8,553,479 B2* | 10/2013 | Lee | ........................... | G11C 8/08 365/194 |
| 8,891,325 B2* | 11/2014 | Choi | ........................ | G11C 8/14 365/203 |
| 9,373,378 B1* | 6/2016 | Chen | .................... | G11C 11/4074 |
| 2017/0178751 A1* | 6/2017 | Choi | ........................ | G11C 29/50 |
| 2021/0272613 A1* | 9/2021 | Jeong | ........................ | G11C 8/14 |

* cited by examiner

*Primary Examiner* — Tri M Hoang
(74) *Attorney, Agent, or Firm* — Holland & Hart LLP

(57) ABSTRACT

Methods, systems, and devices for driving word lines using sub word line drivers are described. A memory array may include a plurality of sub-arrays arranged with gaps in between. Word lines may be arranged across multiple sub-arrays and drive access transistors that are used to selectively access rows (e.g., rows of memory cells) within the sub-arrays. In some examples, signals applied to selection devices driving the word lines may be over-driven for a duration at or near the desired transitions of the word line, and some signals may be driven to a relatively high level for a duration around the high and low transitions of a global row line. Whether a signal is over driven or driven to a relatively high level may depend on the type or types of transistors used in each word line driver.

12 Claims, 8 Drawing Sheets

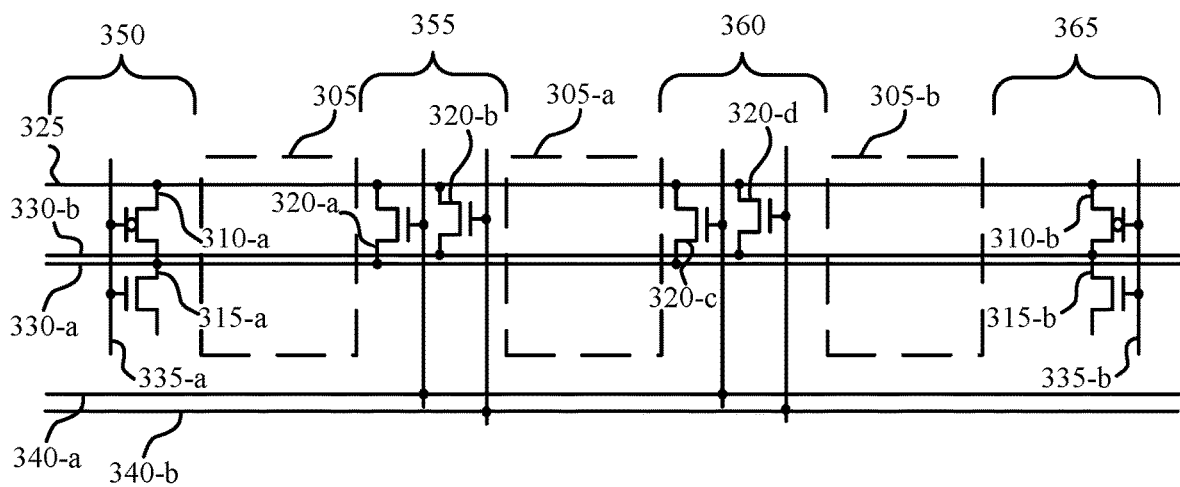
FIG. 3A
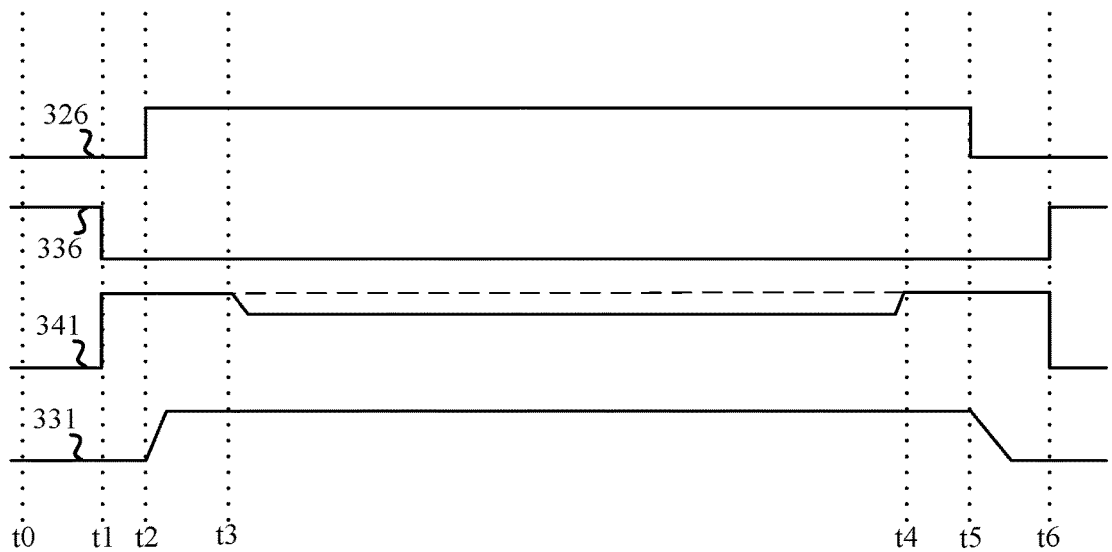
FIG. 3B

US 11,302,381 B1

SUB WORD LINE DRIVER

FIELD OF TECHNOLOGY

The following relates generally to one or more systems for memory and more specifically to techniques for driving word lines using sub word line drivers.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferro-electric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

BRIEF DESCRIPTION OF THE DRAWINGS

FIGS. 3A and 3B illustrate an example of a circuit diagram and corresponding timing diagram that support a sub word line driver in accordance with examples as disclosed herein.

DETAILED DESCRIPTION

Figure 1:
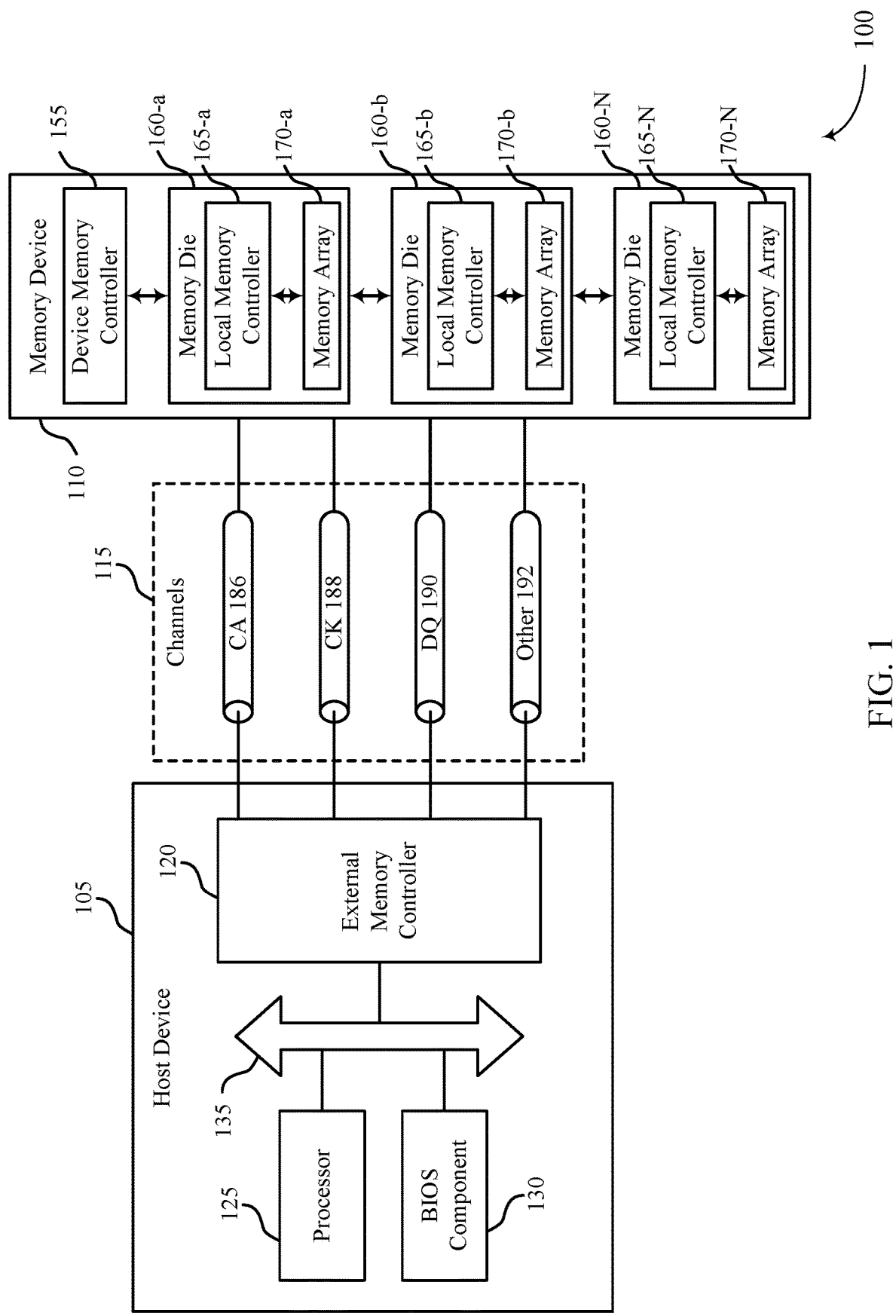
FIG. 1 illustrates an example of a system that supports a sub word line driver in accordance with examples as disclosed herein.

Memory arrays may be arranged in sub-arrays where a word line passes over multiple sub-arrays, and additional row line drivers (e.g., word line selection devices) may be fabricated within the spacing (e.g., gaps) between the sub-arrays to provide additional drive to the word line. Typical drivers may have multiple transistors of different types in the gaps, and it may be beneficial to reduce the size of the spacing between sub-arrays. To access a memory cell of a sub-array, a memory address may be decoded to a word line using a two-step decoding. A global row line that is common to a group of word lines may be decoded, while a phase signal may be used to activate individual word lines within a group having the global row line activated. The phase signal may be asserted prior to the global row line being activated, thus coupling the global row line to one of the local row lines. When the global row line is asserted, it will then drive the selected row line. Traditional drive mechanisms for the selection transistors coupling the global word line to a local word line may either not drive the selection transistors to a level that provides a strong enough drive for the desired slew rate of the word line, or may overdrive the selection transistor and cause possible transistor breakdown. Thus a solution to provide adequate drive to selection transistors while preventing transistor breakdown is desirable.

A memory architecture that provides adequate drive to selection transistors while preventing transistor breakdown is described herein. In particular, single transistor drivers may be fabricated in the gaps between memory sub-arrays. Certain signals (e.g., the phase signal) may be over-driven for a duration at or near the desired transitions of the word line (e.g., transitioning from a high voltage to a low voltage or vice versa). In some instances, n-channel (e.g., NMOS) transistors may be used in the gaps, and the phase signal may be driven to a level higher (e.g., a threshold voltage higher or more than a threshold voltage higher) for a duration around the high and low transitions of the global row line. In other instances, p-channel (e.g., PMOS) transistors may be used in the gaps such that the inverse phase (PHF) signal drops below ground for a duration around the high and low transitions of the global row line. A hybrid driver may use both n-channel and p-channel transistors in the same or alternating gaps, and one or both types of the selection transistors may be overdriven for a duration around the high and low transitions of the global row line. In any of the configurations, drivers may drive the selection transistors in each gap to a level that provides a strong enough drive for the desired slew rate of the corresponding word line, while preventing overdrive that may otherwise cause the selection transistor to break down over time.

Features of the disclosure are initially described in the context of systems and dies as described with reference to FIGS. 1 and 2. Features of the disclosure are described in the context of circuit diagrams and corresponding timing diagrams as discussed with reference to FIGS. 3A through 6B. These and other features of the disclosure are further illustrated by and described with reference to an apparatus diagram and flowcharts that relate to a sub word line driver as described with reference to FIGS. 7 and 8.

FIG. 1 illustrates an example of a system 100 that supports a sub word line driver in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may receive a command (e.g., an access command) from the host device 105. An address of the command may be decoded as described herein. For example, the device memory controller 155 or a local memory controller 165 may decode an address associated with the command and may activate one or more drivers and/or apply one or more signals to respective signal lines associated with a memory array 170.

For example, the memory array 170-a may include a plurality of sub-arrays, and may include various word line drivers to drive a selected word line. Each sub-array may be associated with a set of word lines that extend across the entire memory array 170, as well as a global row line. Moreover, the memory array 170 may include one or more phase lines (e.g., and inverse phase or phase bar lines). The device memory controller 155 or the local memory controller 165-a may apply various signals to the global row line, phase line(s), and phase bar line(s), as described herein, to facilitate an access operation. Drivers associated with each sub-array may drive selection transistors in each gap (e.g., each gap between each sub-array) to a level that provides a strong enough drive for the desired slew rate of a selected word line, while preventing overdrive that may otherwise cause the selection transistor to break down over time.

Figure 2:
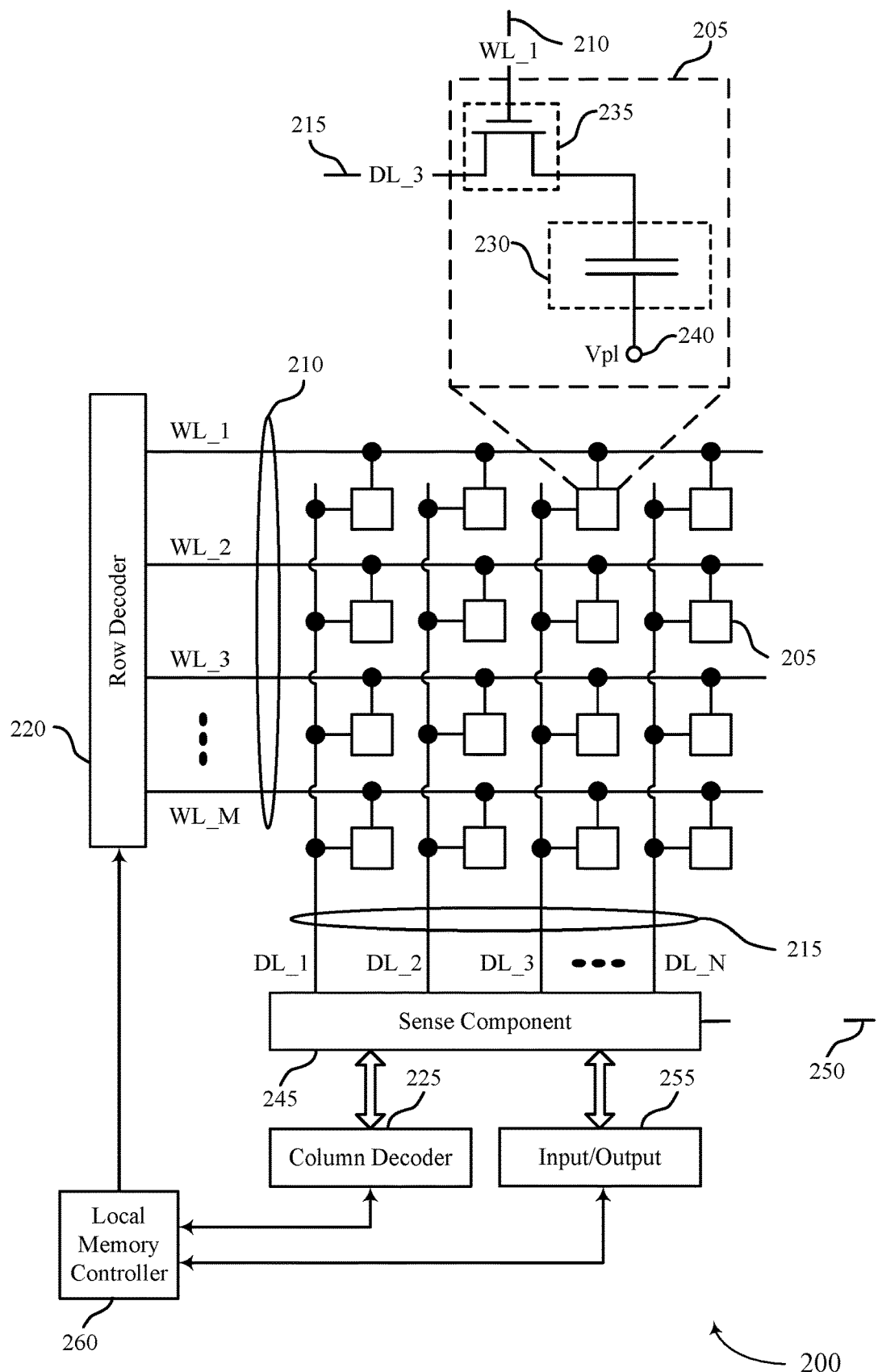
FIG. 2 illustrates an example of a memory die that supports a sub word line driver in accordance with examples as disclosed herein.

FIG. 2 illustrates an example of a memory die 200 that supports a sub word line driver in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. In some examples, the row decoder 220 and/or the column decoder 225 may decode an access command, which may result in various signals being applied to access lines (e.g., to a global row line, a phase line, a phase bar line, etc.) to facilitate an access operation.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some examples, the local memory controller 260 may receive a command (e.g., an access command) from a host device (e.g., a host device 105 as described with reference to FIG. 1). An address of the command may be decoded by the column decoder 225 and the row decoder 220. Decoding an address associated with the command and may result in one or more drivers being activated and/or one or more signals being applied to respective signal lines associated with a memory array die 200.

For example, the memory array die 200 may be an example of one of a plurality of sub-arrays of a memory array, and may include various word line drivers to drive a selected word line. The sub-array may be associated with a set of word lines 210 that extend across an entire memory array, as well as a global row line (not shown). Moreover, the memory array may include one or more phase lines and phase bar lines (not shown). The local memory controller 260 may apply various signals to the global row line, phase line(s), and phase bar line(s), as described herein, to facilitate an access operation. Drivers associated with each sub-array may drive selection transistors in each gap (e.g., each gap between each sub-array) to a level that provides a strong enough drive for the desired slew rate of a selected word line, while preventing overdrive that may otherwise cause the selection transistor to break down over time.

FIG. 3A illustrates an example of a circuit diagram 300-a that supports a sub word line driver in accordance with examples as disclosed herein. The circuit diagram 300-a may illustrate an example of one or more drivers (or one or more aspects of one or more drivers) that may be operated to drive a particular word line (e.g., a word line 330-a or a word line 330-b). The circuit diagram 300-a may illustrate an array of memory cells that is arranged in a plurality of sub-arrays 305. One or more word lines 330 may pass over the sub-arrays, and additional drivers may be located within the gaps between each sub-array 305. For example, a main gap 350 (e.g., a main sub word line driver (SWD) gap) may include a first driver for driving a word line 330-a using a global word line (GR) 325, a phase line (PH) 340-a, and a phase bar line (PHF) 335-a. In some examples, the main gap 350 may also include additional word line drivers for driving other word lines. Additionally or alternatively, a gap subsequent to the main gap (e.g., each SWD gap) may include single transistor drivers, which may reduce the spacing between each sub-array 305 by not necessitating additional transistor wells or spacing between transistors of different types. Moreover, drivers may drive the selection transistors in each gap to a level that provides a strong enough drive for the desired slew rate of the corresponding word line, while preventing overdrive that may otherwise cause the selection transistor to break down over time.

As described herein, the main SWD gap 350 illustrated in FIG. 3A may be located on a first side of the first sub-array 305. The main SWD gap 350 may include a first selection device 310-a (e.g., a first transistor) of a first type. In some examples, the first selection device 310-a may be a p-type (e.g., a PMOS) transistor. A source of the first selection device 310-a may be coupled with a first access line 325 and a drain of the first selection device 310-a may be coupled with a second access line 330-a. The first access line 325 may be a global row line and the second access line 330-a may be a word line. In some examples, the first selection device 310-a may couple the global row line 325 with the word line 330-a based on a third access line 335-a. For example, the third access line 335-a may be a phase bar line 335-a that is coupled with the gate of the first selection device 310-a. Thus the first selection device 310-a may couple the global row line 325 with the word line 330-a based on a low (relatively low or negative) voltage (e.g., VNWL) being applied to the phase bar line 335-a. For example, the voltage (e.g., VNWL) may be the N-well voltage for the memory array, and may be ground or may be a voltage other than ground (e.g., negative voltage).

In some examples, the main SWD gap 350 may include an additional selection device 315-a of a second type. In some examples, the selection device 315-a may be an n-type (e.g., an NMOS) transistor. A source of the selection device 315-a may be coupled with a voltage source (e.g., VNWL) and a drain of the selection device 315-a may be coupled with the word line 330-a. In some examples, the selection device 315-a may couple the word line 330-a with the voltage source (e.g., VNWL) based on a relatively high voltage (e.g., high relative to VNWL) being applied to the phase bar line 335-a.

Additionally or alternatively, the main SWD gap 350 may include one or more selection devices associated with additional word lines 330. In some examples, a first selection device 310-b (e.g., similar to selection device 310-a but having the drain coupled with word line 330-b) may be configured to couple the global row line 325 with a word line 330-b based on a signal applied to an additional phase bar line. The word line driver in the main SWD gap 350 (that includes the selection device 310-a and the selection device 315-a) may be repeated for the word line 330-b and for each additional word line extending across the memory array. For example, the SWD gap 355 may include a selection device 320-b configured to couple the global row line 325 with the word line 330-b, the SWD gap 360 may include a selection device 320-d to couple the global row line 325 with the word line 330-b.

The additional word line drivers may be driven by an additional phase bar lines 340-b. In some examples, the SWD gaps may include additional selection devices configured to couple additional word lines with the global row line 325 and may be driven by additional phase lines. For example, the additional word line drivers may be driven by additional phase lines, such as PH0, PH1, etc., and additional phase bar lines, such as PHF0, PHF1, etc. Moreover, a second selection device (e.g., similar to selection device 315-a but having the drain coupled with word line 330-b) may be coupled with the voltage source (e.g., VNWL) and may be configured to couple the word line 330-b with the voltage source based on a high voltage (e.g., high relative to VNWL) being applied to the additional phase bar line.

The circuit diagram 300-a may illustrate additional gaps (e.g., SWD gaps) that are located between each of the sub-arrays 305. For example, a first SWD gap 355 may be located on a second side of the first sub-array 305 (and on a first side of a second sub-array 305-a). Because each word line 330 that extends through the memory array may have substantial capacitance and resistance, local word line drivers may be fabricated in each SWD gap (e.g., each SWD gap such as the first SWD gap 355, the second SWD gap 360, etc.). In some examples, the local word line drivers in each gap may be configured to drive a subset of a total quantity of word lines 330. For example, in some SWD gaps (e.g., "even" SWD gaps) the local driver may be configured to drive even word lines 330 (e.g., a second word line 330, a fourth word line 330, etc.). In other examples, in some SWD gaps (e.g., "odd" SWD gaps) the local driver may be configured to drive odd word lines 330 (e.g., a first word line 330, a third word line 330, etc.). In such a configuration, the main SWD gap may be configured to drive the even word lines 330, and the circuit diagram 300-a may include a second main SWD gap 365 located at the opposite end of the array that includes selection device 310-b and selection device 315-b that are coupled with a phase bar line 335-b and configured to drive the odd word lines 330, such as the word line 330-b.

As shown in FIG. 3A, the local word line driver located in the first SWD gap 355 may include a second selection device 320-a (e.g., a second transistor) of the second type. As described herein, a second selection device of a second type may be an NMOS transistor. The local word line driver that includes the second selection device may receive substantially the same signals that are used to control the drivers in the main SWD gap 350. However, the presence of the driver in the first SWD gap 355 (and subsequent SWD gaps) may provide a strong enough drive for the desired slew rate of the corresponding word line, while preventing overdrive that may otherwise cause the selection transistor to break down over time.

In some examples, the second selection device 320-a may be an n-type (e.g., an NMOS) transistor. A source of the second selection device 320-a may be coupled with the word line 330-a and a drain of the second selection device 320-a may be coupled with the global row line 325. In some examples, the second selection device 320-a may couple the global row line 325 with the word line 330-a based on a fourth access line 340-a. For example, the fourth access line 340-a may be a phase line 340-a that is coupled with the gate of the second selection device 320-a. Thus the second selection device 320-a may couple the global row line 325 with the word line 330-a based on a high voltage (e.g., high relative to VNWL) being applied to the phase line 340-a. In some examples, the phase line 340-a and the phase line 340-b (and any additional phase lines that are not shown in FIG. 3) may run vertically in the memory array through the SWD gaps, and may thus not run across the array (e.g., the direction of the word lines). By running the phase lines vertically through the SWD gaps, there may be more area available for the word lines and global row lines.

The first SWD gap 355 may include a plurality of additional transistors that are configured to couple respective local word lines to the global row line 325. The transistor 320-b may be configured to couple the word line 330-b to the global row line 325 based on a relatively high voltage (e.g., high relative to VNWL) being applied to a second phase line 340-b. Thus each SWD gap may include a plurality of transistors that are each associated with a respective word line and are configured to couple the respective word lines with the global row line 325. For example, each gap may include N transistors that are coupled with N phase lines and are each associated with a respective word line. In this example, N may be a positive integer that corresponds to the quantity of word lines corresponding to a single global row line (such as the global row line 325) extending through the memory array. Alternatively, as discussed above, each gap may include N/K transistors coupled with N/K of the N phase lines, where K is an integer that is less than N (e.g., even gaps may have transistors for even word lines, odd gaps may have transistors for odd word lines).

In some examples, the global row line 325 may be common to a group of word lines that includes the word line 330-*a* and the word line 330-*b*. As described herein, a memory address may be decoded to a word line using a two-step decoding, and the global word line may be associated with a timing of an access operation. For example, a signal may be asserted to the phase line 340-*a* (e.g., asserted to a gate of the selection device 320-*a*) to couple the global row line 325 to the word line 330-*a* before the global row line 325 is driven (e.g., to VCCP). Accordingly, when the global row line 325 is driven to VCCP, the selected word line 330-*a* will also be driven to the same voltage (e.g., to VCCP). In some examples VCCP, which may be referred to herein as a second level, may be correspond to a desired voltage of the word lines 330-*a* in order to drive the selection transistors of the memory cells to access the memory cells (e.g., read or write the memory cells from the bit lines).

The circuit diagram 300-*a* may illustrate additional SWD gaps that are located between each of the sub-arrays 305. For example, the circuit diagram 300-*a* may illustrate a second SWD gap 360 that includes a selection device 320-*c* and a selection device 320-*d*. Each SWD gap may include additional transistors coupled with respective word lines and phase lines. For example, each SWD gap may include one transistor to drive each word line from the global row line 325, and a gate of each additional transistor may be coupled with a respective phase line of a set of phase lines (e.g., PH0, PH1, PH2, etc.). Each selection device may couple the global row line 325 with a respective word line based on a respective phase line being driven to a relatively high voltage (e.g., VCCP or VCCP2). As discussed herein, the presence of the drivers in each SWD gap may provide a strong enough drive for the desired slew rate of the corresponding word line, while preventing overdrive that may otherwise cause the selection transistor to break down over time. The size of the SWD gaps 355 and 360 may be determined by the area for the selection devices 320, and thus reducing a size or quantity of devices within the gaps may reduce the size of the gaps and ultimately the memory device.

FIG. 3B illustrates an example of a timing diagram 300-*b* that supports a sub word line driver in accordance with examples as disclosed herein. The timing diagram 300-*b* may illustrate the timing associated with operating aspects of the circuit diagram 300-*a* as described with reference to FIG. 3A. For example, the timing diagram 300-*b* may illustrate the timing of signals applied to a global row line 325, a phase bar line 335-*a*, a phase line 340-*a*, and a word line 330-*a* as described with reference to FIG. 3A. For example, a signal 326 may be applied to the global row line 325, a signal 336 may be applied to the phase bar line 335-*a*, a signal 341 may be applied to the phase line 340-*a*, and a signal 331 may be applied to the word line 330-*a*. The signal applied to each of the lines may activate or deactivate particular selection transistors to a level that provides a strong enough drive for the desired slew rate of the word line 330-*a*, while preventing overdrive that may otherwise cause the selection transistor to break down over time.

At t0, the first access line 325 (e.g., the global row line 325), the second access line 330-*a* (e.g., the word line 330-*a*), and the fourth access line 340-*a* (e.g., the phase line 340-*a*) may each be maintained at a first level (e.g., VNWL). In some examples, VNWL may be a relatively low (ground or negative) voltage level. At t0, the third access line 335-*a* (e.g., the phase bar line 335-*a*) may be maintained at a second level (e.g., VCCP). In some examples, the third access line 335-*a* may be driven (e.g., actively driven) to the second level, and the second level may be a higher level than the first level (e.g., VCCP may be higher than VNWL). When the phase bar line 335-*a* is maintained at (or driven to) the second level, the selection device 315-*a* may be activated thus coupling the word line 330-*a* with the source for selection device 315-*a* (e.g., VNWL). Additionally or alternatively, when the phase bar line 335-*a* is maintained at (or driven to) the second level and the phase line 340-*a* is maintained at the first level, the selection device 310-*a* and the selection device 320-*a* may each be deactivated. Thus, at t0 the global row line 325 may not be coupled with the word line 330-*a*.

At t1, the phase bar line 335-*a* may transition to the first level (e.g., to VNWL). In some examples, the phase bar line 335-*a* may be driven (e.g., actively driven) to VNWL. Additionally or alternatively, the phase line 340-*a* may transition to a third level (e.g., VCCP2), which may be higher than the second level (e.g., VCCP2 may be higher than VCCP). In some examples, the phase line 340-*a* may be driven (e.g., actively driven) to VCCP2. At t1, the global row line 325 may be maintained at the first level (e.g., at VNWL). As described herein, the global row line 325 may be driven (e.g., actively driven) to the first level. At t1, the word line 330-*a* may remain at the first level (e.g., at VNWL). When the phase bar line 335-*a* is driven to the first level, the selection device 315-*a* may be deactivated and the selection device 310-*a* may be activated, thus coupling the global row line 325 with the word line 330-*a*. Moreover, when the phase line 340-*a* is driven to the third level, the selection devices 320-*a*, 320-*c*, and 320-*d* may be activated thus coupling the global row line 325 with the word line 330-*a*.

At t2, the global row line 325 may be driven to the second level (e.g., to VCCP), and the phase bar line 335-*a* and the phase line 340-*a* may be maintained at the same levels. Because the global row line 325 may be coupled with the word line 330-*a* (e.g., based on the signaling at t1), the word line 330-*a* may begin to transition to the second level (e.g., to VCCP). Thus, at a duration after t2 (and before t3), the word line 330-*a* may reach VCCP.

At t3, the phase line 340-*a* may be driven to the second level (e.g., to VCCP), and the global row line 325, the word line 330-*a*, and the phase bar line 335-*a* may be maintained at the same levels. The second level (e.g., VCCP) may be a threshold voltage of the selection device 320-*a* lower than the third level (e.g., VCCP2). Thus, driving the phase line 340-*a* to the second level may not deactivate the selection devices 320-*a*, 320-*c*, and 320-*d*. Instead, the selection devices may remain activated and the word line 330-*a* may be maintained at the second level (e.g., at VCCP). For example, driving the gate of the selection devices 320-*a*, 320-*c*, and 320-*d* to VCCP2 may ensure that the entire transition of the word line 330-*a* occurs with the selection devices not in cut-off or sub-threshold, and thus may be actively driven using the selection devices 320-*a*, 320-*c*, and 320-*d*. If VCCP was used on the gate of the selection devices 320-*a*, 320-*c*, and 320-*d* during the transition of the word line 330-*a*, the selection devices 320-*a*, 320-*c*, and 320-*d* may provide good drive strength for the word line 330-*a* until the word line 330-*a* reaches a threshold below VCCP. At this time (e.g., when the word line 330-*a* reaches a threshold below VCCP), the selection devices 320-*a*, 320-*c*, and 320-*d* may begin to operate in sub-threshold or cut-off regions, where their strength is much lower. Therefore, the word line 330-*a* would effectively be driven to from a threshold below VCCP to VCCP by the selection device 310-*a*. Once the word line 330-*a* reaches VCCP, reducing the gate voltage on the selection device 320-*a* may also effectively put it in sub-threshold or cut-off. However, since the word line 330-*a* is already driven (e.g., to VCCP), less drive is required to maintain the word line 330-*a* at VCCP, thus mitigating any effects resulting from the word line 330-*a* being driven only by the selection device 310-*a*. Driving the phase line 340-*a* to VCCP for the time the global row line is asserted other than the transitions may prevent overdrive on the selection devices 320-*a*, 320-*c*, and 320-*d* that would otherwise cause the selection devices 320-*a*, 320-*c*, and 320-*d* to break down over time.

At t4, the phase line 340-*a* may be driven to the third level (e.g., to VCCP2), and the global row line 325, the word line 330-*a*, and the phase bar line 335-*a* may be maintained at the same levels. Driving the phase line 340-*a* to VCCP 2 may provide additional drive as the global row line 325 transitions from VCCP to a threshold below VCCP. In some examples, the phase line 340-*a* may not be driven to the third level for a second time, and instead may be driven to the second level (e.g., VCCP) for an extended duration (e.g., until t6).

At t5, the global row line 325 may be driven to the first level (e.g., to VNWL), and the phase bar line 335-*a* and the phase line 340-*a* may be maintained at the same levels. Because the global row line 325 may be coupled with the word line 330-*a* (e.g., based on the signaling at t1), the word line 330-*a* may begin to transition downward to the first level (e.g., to VNWL). Thus, at a duration after t5 (and before t6), the word line 330-*a* may reach VNWL.

At t6, the phase bar line 335-*a* may transition to the second level (e.g., to VCCP). In some examples, the phase bar line 335-*a* may be driven (e.g., actively driven) to VCCP. Additionally or alternatively, the phase line 340-*a* may transition to the first level (e.g., VNWL). In some examples, the phase line 340-*a* may be driven (e.g., actively driven) to VNWL. At t6, the global row line 325 and the word line 330-*a* may each be maintained at the first level (e.g., at VNWL). When the phase bar line 335-*a* is driven to the second level, the selection device 315-*a* may be activated and the selection device 310-*a* may be deactivated, thus coupling the word line 330-*a* with the source of the selection device 315-*a*. Moreover, when the phase line 340-*a* is driven to the first level, the selection device 320-*a* may be deactivated thus decoupling the global row line 325 from the word line 330-*a*. Thus the timing scheme described with reference to FIG. 3B may provide a strong enough drive for the desired slew rate of the word line 330-*a*, while preventing overdrive that may otherwise cause the selection devices 320-*a*, 320-*c*, and 320-*d* to break down over time.

Figure 4A:
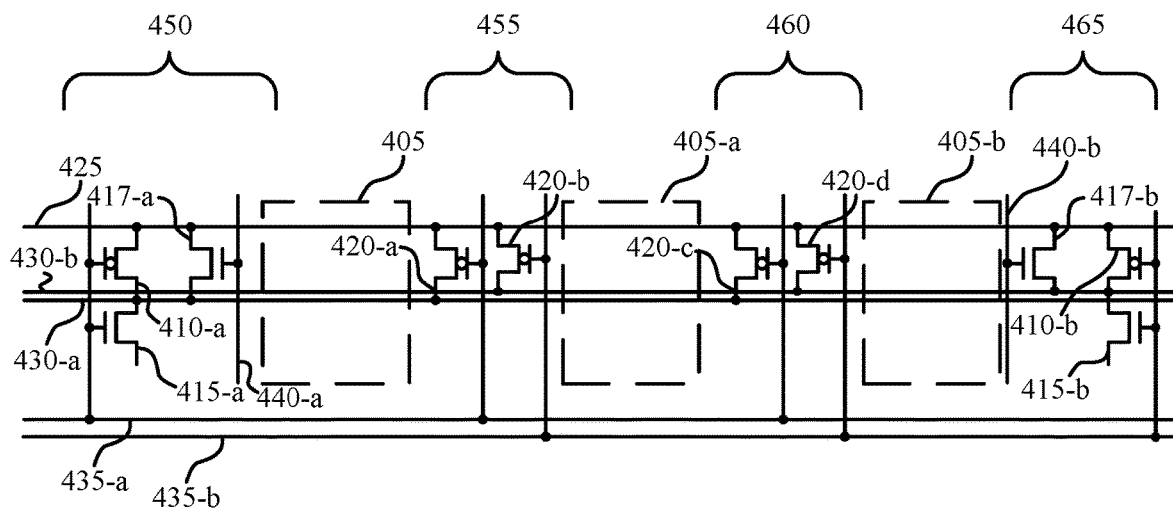
FIGS. 4A and 4B illustrate an example of a circuit diagram and corresponding timing diagram that support a sub word line driver in accordance with examples as disclosed herein.

FIG. 4A illustrates an example of a circuit diagram 400-*a* that supports a sub word line driver in accordance with examples as disclosed herein. The circuit diagram 400-*a* may illustrate an example of one or more drivers (or one or more aspects of one or more drivers) that may be operated to drive a particular word line (e.g., a word line 430). The circuit diagram 400-*a* may illustrate an array of memory cells that is arranged in a plurality of sub-arrays 405. One or more word lines 430 may pass over the sub-arrays, and additional drivers may be located within the gaps between each sub-array 405. For example, a main SWD gap 450 may include a driver for driving a word line 430-*a* from a global row line (GR) 425, a phase line 440-*a*, and a phase bar line 435-*a*. In some examples, SWD gaps subsequent to the main SWD gap 450 (e.g., each SWD gap) may include single transistor drivers, which may reduce the spacing between each sub-array 405. Moreover, drivers may drive the selection transistors in each gap to a level that provides a strong enough drive for the desired slew rate of the corresponding word line, while preventing overdrive that may otherwise cause the selection transistor to break down over time.

As described herein, the main SWD gap 450 illustrated in FIG. 4A may be located on a first side of the first sub-array 405. The main SWD gap 450 may include a first selection device 410-*a* (e.g., a first transistor) of a first type. In some examples, the first selection device 410-*a* may be a p-type (e.g., a PMOS) transistor. A source of the first selection device 410-*a* may be coupled with a first access line 425 and a drain of the first selection device 410-*a* may be coupled with a second access line 430-*a*. The first access line 425 may be a global row line and the second access line 430-*a* may be a word line. In some examples, the first selection device 410-*a* may couple the global row line 425 with the word line 430-*a* based on a third access line 435-*a*. For example, the third access line 435-*a* may be a phase bar line 435 that is coupled with the gate of the first selection device 410-*a*. Thus the first selection device 410-*a* may couple the global row line 425 with the word line 430-*a* based on a relatively low (or negative) voltage (e.g., VNWL) being applied to the phase bar line 435-*a*. For example, the voltage (e.g., VNWL) may be the N-well voltage for the memory array, and may be ground or may be a voltage other than ground (e.g., negative voltage).

In some examples, the main SWD gap 450 may include a third selection device 417-*a* of a second type. In some examples, the third selection device 417-*a* may be an n-type (e.g., an NMOS) transistor. A source of the third selection device 417-*a* may be coupled with the global row line 425 and a drain of the third selection device 417-*a* may be coupled with the word line 430-*a*. The gate of the third selection device 417-*a* may be coupled with a fourth access line 440-*a*, which may be a phase line 440-*a*. In some examples, the third selection device 417-*a* may couple the word line 430-*a* with the global row line 425 based on a relatively high voltage (e.g., VCCP) being applied to the phase line 440-*a*. In some examples, the presence of the third selection device 417-*a* may improve the rate at which the word line 430-*a* is driven to a voltage (e.g., VCCP). For example, the third selection device 417-*a* may be an n-type (e.g., an NMOS) transistor and thus may have a relatively higher carrier mobility. Moreover, when a signal of the phase bar line 440-*a* goes low and the global row line 425 is less than a threshold above VNWL, the first selection device 410-*a* may be in a sub-threshold and may not conduct well. Accordingly, the third selection device 417-*a* may help drive the word line 430-*a* during this duration (e.g., during an early portion of when the global row line 425 transitions from VNWL to VCCP).

In some examples, the main SWD gap 450 may include an additional selection device 415-*a* of the second type. In some examples, the selection device 415-*a* may be an n-type (e.g., an NMOS) transistor. A source of the selection device 415-*a* may be coupled with a voltage source (e.g., VNWL) and a drain of the selection device 415-*a* may be coupled with the word line 430-*a*. In some examples, the selection device 415-*a* may couple the word line 430-*a* with the voltage source (e.g., VNWL) based on a relatively high voltage (e.g., VCCP) being applied to the phase bar line 435-*a*. Additionally or alternatively, the main SWD gap 450 may include one or more selection devices associated with additional word lines 430.

The word line driver in the main SWD gap 450 (that includes the selection device 410-*a*, the selection device 415-*a*, and the selection device 417-*a*) may be repeated for additional word lines of a group of word lines that is associated with a global row line. In some cases, the memory device may include main SWD gaps 450 and 465 on opposite sides of the sub-arrays 405. In such a configuration, the main SWD gap 450 may be configured to drive the even word lines 430, and the circuit diagram 400-*a* may include a second main SWD gap 465 located at the opposite end of the array that includes a selection device 417-*b* configured to couple the global row line 425 with the word line 430-*b* based on a phase line 440-*b*, and selection devices 410-*b* and 415-*b* which may couple the word line 430-*b* with the global row line 425 or a voltage source based on a phase bar line 435-*b*.

The circuit diagram 400-*a* may illustrate additional gaps (e.g., SWD gaps) that are located between each of the sub-arrays 405. For example, a first SWD gap 455 may be located on a second side of the first sub-array 405 (and on a first side of a second sub-array 405-*a*). Because each word line 430 that extends through the memory array may have substantial capacitance and resistance, local word line drivers may be fabricated in each SWD gap. In some examples, the local word line drivers may be configured to drive a subset of a total quantity of word lines 430. For example, in some SWD gaps (e.g., "even" SWD gaps) the local driver may be configured to drive even word lines 430 (e.g., a second word line 430, a fourth word line 430, etc.). In other examples, in some SWD gaps (e.g., "odd" SWD gaps) the local driver may be configured to drive odd word lines 430 (e.g., a first word line 430, a third word line 430, etc.).

As shown in FIG. 4A, the local word line driver located in the first SWD gap 455 may include a second selection device 420-*a* (e.g., a second transistor) of the first type. The local word line driver that includes the second selection device may receive substantially the same signals that are used to control the drivers in the main SWD gap 450. However, the presence of the driver in the first SWD gap 450 (and subsequent SWD gaps) may provide a strong enough drive for the desired slew rate of the corresponding word line, while preventing overdrive that may otherwise cause the selection transistor to break down over time.

In some examples, the second selection device 420-*a* may be a p-type (e.g., a PMOS) transistor. A source of the second selection device 420-*a* may be coupled with the global row line 425 and a drain of the second selection device 420-*a* may be coupled with the word line 430-*a*. In some examples, the second selection device 420-*a* may couple the global row line 425 with the word line 430-*a* based on a signal applied to the phase bar line 435-*a*. For example, the second selection device 420-*a* may couple the global row line 425 with the word line 430-*a* based on a relatively low voltage (e.g., VNWL or VNWL_DEEP) being applied to the phase bar line 435-*a*. As described herein, in some examples, the phase bar line 435-*a* may be driven, for a duration, to VNWL_DEEP in order to more strongly activate the selection device 410-*a* and the selection device 420-*a*. In some examples, VNWL_DEEP may be a voltage that is lower (e.g., a threshold voltage lower) than VNWL.

The first SWD gap 455 may include a plurality of additional transistors that are configured to couple respective word lines to the global row line 425. For example, as described with reference to FIG. 3A, each word line of a group of word lines may be coupled with the global row line 425 via a respective selection device located in each SWD gap. Thus each SWD gap may include a plurality of transistors that are each associated with a respective word line (of a group of word lines) and are configured to couple the respective word lines with the global row line 425 (or another global row line associated with the memory array). The additional word line drivers may be driven by an additional phase bar lines, such as PHF0, PHF1, etc. For example, the SWD gap 455 may include a selection device 420-*b* configured to couple the global row line 425 with the word line 430-*b*, the SWD gap 460 may include a selection device 420-*d* to couple the global row line 425 with the word line 430-*b*.

In some examples, the global row line 425 may be common to a group of word lines that includes the word lines 430-*a* and 430-*b* (and other word lines that are not shown). As described herein, a memory address may be decoded to a word line using a two-step decoding, and the global row line 425 may be associated with a timing of an access operation. For example, a signal may be asserted to the phase bar line 435-*a* (e.g., asserted to a gate of the selection device 420-*a*) to couple the global row line 425 to the word line 430-*a* before the global row line 425 is driven (e.g., to VCCP). Accordingly, when the global row line 425 is driven to a relatively high voltage, the selected word line 430-*a* will also be driven to the same voltage (e.g., to VCCP).

The circuit diagram 400-*a* may illustrate additional SWD gaps that are located between each of the sub-arrays 405. For example, the circuit diagram 400-*a* may illustrate a second SWD gap 460 that includes a selection device 420-*c* and a selection device 420-*d*. Each SWD gap may include additional transistors coupled with respective word lines and phase bar lines. Each selection device may couple the global row line 425 with a respective word line 430 based on a respective phase bar line being driven to a relatively low voltage (e.g., VNWL or VNWL_DEEP). As discussed herein, the presence of the drivers in each SWD gap may provide a strong enough drive for the desired slew rate of the corresponding word line, while preventing overdrive that may otherwise cause the selection transistor to break down over time. The size of the SWD gaps 455 and 460 may be determined by the area for the selection devices 420, and thus reducing a size or quantity of devices within the gaps may reduce the size of the gaps and ultimately the memory device.

Figure 4B:
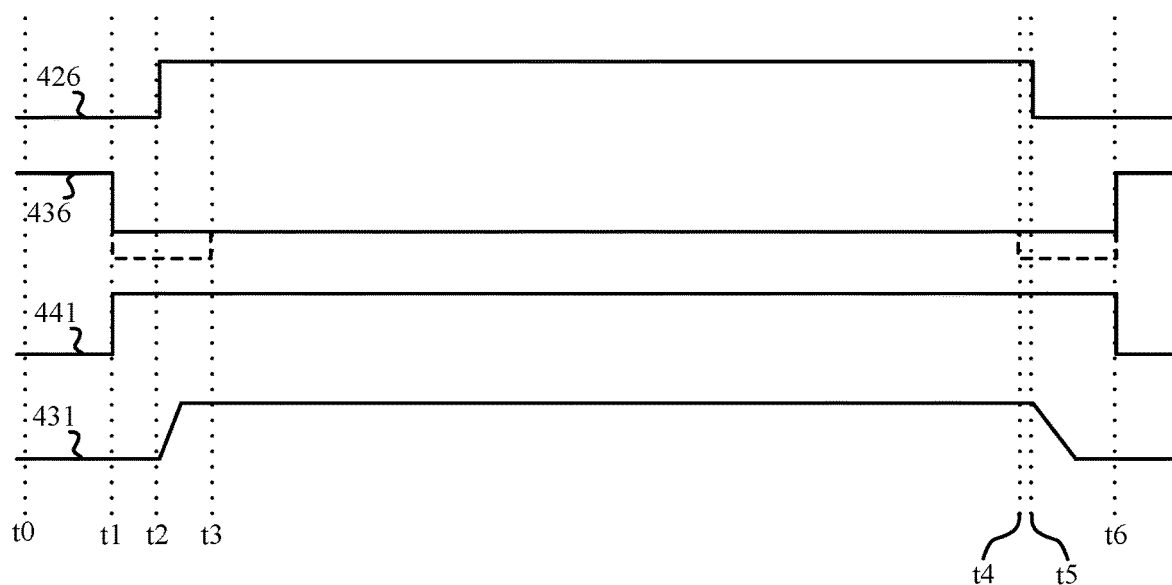

FIG. 4B illustrates an example of a timing diagram 400-*b* that supports a sub word line driver in accordance with examples as disclosed herein. The timing diagram 400-*b* may illustrate the timing associated with operating aspects of the circuit diagram 400-*a* as described with reference to FIG. 4A. For example, the timing diagram 400-*b* may illustrate the timing of signals applied to a global row line 425 a phase bar line 435-*a*, a phase line 440-*a*, and a word line 430-*a* as described with reference to FIG. 4A. For example, a signal 426 may be applied to the global row line 425, a signal 436 may be applied to the phase bar line 435-*a*, a signal 441 may be applied to the phase line 440-*a*, and a signal 431 may be applied to the word line 430-*a*. The signal applied to each of the lines may activate or deactivate particular selection transistors to a level that provides a strong enough drive for the desired slew rate of the word line 430-*a*, while preventing overdrive that may otherwise cause the selection transistor to break down over time.

At t0, the first access line 425 (e.g., the global row line 425) and the fourth access line 440-*a* (e.g., the phase line 440-*a*) may each be maintained at a first level (e.g., VNWL). In some examples, VNWL may be a relatively low (or negative) voltage level. At t0, the third access line 435-*a* (e.g., the phase bar line 435-*a*) may be maintained at a second level (e.g., VCCP). In some examples, the third access line 435-*a* may be driven (e.g., actively driven) to the second level, and the second level may be a higher level than the first level (e.g., VCCP may be higher than VNWL). When the phase bar line 435-*a* is maintained at (or driven to) the second level, the selection device 415-*a* may be activated thus coupling the word line 430-*a* with the voltage source (e.g., VNWL). Additionally or alternatively, when the phase bar line 435-*a* is maintained at (or driven to) the second level and the phase line 440-*a* is maintained at the first level, the selection device 410-*a*, the selection device 417-*a*, and the selection device 420-*a* may each be deactivated. Thus, at t0 the global row line 425 may not be coupled with the word line 430-*a*.

At t1, the phase bar line 435-*a* may be driven to a fourth level (e.g., to VNWL_DEEP). In some examples, the phase bar line 435-*a* may be driven (e.g., actively driven) to VNWL_DEEP. Driving the phase bar line 435-*a* to VNWL_DEEP may ensure that the selection device 410-*a* and the selection device(s) 420-*a* are activated. As discussed herein, VNWL_DEEP may be a relatively low voltage that activates the selection device 410-*a* and the selection device 420-*a* more strongly than if, for example, VNWL was applied. By applying VNWL_DEEP, and activating the selection device 410-*a* and the selection device 420-*a* more strongly, the voltage of the word line 430-*a* may increase from VNWL to VCCP more rapidly.

Additionally or alternatively, the phase line 440-*a* may transition to a second level (e.g., VCCP). In some examples, the phase line 440-*a* may be driven (e.g., actively driven) to VCCP. At t1, the global row line 425 and the word line 430-*a* may each be maintained at the first level (e.g., at VNWL). When the phase bar line 435-*a* is driven to the fourth level, the selection device 415-*a* and the selection device 420-*a* may be deactivated, and the selection device 410-*a* may be activated, thus coupling the global row line 425 with the word line 430-*a*. Moreover, when the phase line 440-*a* is driven to the second level, the selection device 417-*a* may be activated thus coupling the global row line 425 with the word line 430-*a*.

At t2, the global row line 425 may be driven to the second level (e.g., to VCCP), and the phase bar line 435-*a* and the phase line 440-*a* may be maintained at the same levels. Because the global row line 425 may be coupled with the word line 430-*a* (e.g., based on the signaling at t1), the word line 430-*a* may begin to transition to the second level (e.g., to VCCP). In particular, the rate at which the word line 430-*a* transitions to VCCP may be increased due to the relatively low voltage (e.g., VNWL_DEEP) being applied to the phase bar line 435-*a*. Thus by applying VNWL_DEEP, the selection device 410-*a* and the selection devices 420 may be more-strongly activated than if applying VNWL. That is, applying VNWL_DEEP to the phase bar line 430-*a* may activate the selection device 410-*a* and the selection devices 420 more strongly than if VNWL was applied, which may allow the word line 430-*a* to reach VCCP faster. Thus, at a duration after t2 (and before t3), the word line 430-*a* may reach VCCP.

At t3, the phase bar line 435-*a* may be driven to the first level (e.g., VNWL) and the global row line 425, the word line 430-*a*, and the phase line 440-*a* may be maintained at the same levels. For example, the phase bar line 435-*a* may be driven to VNWL after the word line 430-*a* reaches VCCP. Driving the phase bar line 435-*a* to the first level may not deactivate the selection device 410-*a* or the selection devices 420. Instead, the selection device 410-*a* and the selection devices 420 may remain activated and the word line 430-*a* may be maintained at the second level (e.g., at VCCP). By driving the phase bar line 435-*a* to VNWL (e.g., after driving it to VNWL_DEEP for a duration), less stress may be placed on the selection device 410-*a* and the selection devices 420. Accordingly, driving the phase bar line 435-*a* to VNWL after driving it to VNWL_DEEP may provide a strong enough drive for the desired slew rate of the word line 430-*a*.

At t4, the phase bar line 435-*a* may be driven to the fourth level (e.g., to VNWL_DEEP), and the global row line 425, the word line 430-*a*, and the phase line 440-*a* may be maintained at the same levels. In some examples, the phase bar line 435-*a* may not be driven to the fourth level for a second time, and instead may be driven to the first level (e.g., VNWL) for an extended duration (e.g., until t6).

At t5, the global row line 425 may be driven to the first level (e.g., to VNWL), and the phase bar line 435-*a* and the phase line 440-*a* may be maintained at the same levels. Because the global row line 425 may be coupled with the word line 430-*a* (e.g., based on the selection device 410-*a* and the selection devices 420), the word line 430-*a* may begin to transition downward to the first level (e.g., to VNWL). Thus, at a duration after t5 (and before t6), the word line 430-*a* may reach VNWL.

At t6, the phase bar line 435-*a* may transition to the second level (e.g., to VCCP). In some examples, the phase bar line 435-*a* may be driven (e.g., actively driven) to VCCP. Additionally or alternatively, the phase line 440-*a* may transition to the first level (e.g., VNWL). In some examples, the phase line 440-*a* may be driven (e.g., actively driven) to VNWL. At t6, the global row line 425 and the word line 430-*a* may each be maintained at the first level (e.g., at VNWL). When the phase bar line 435-*a* is driven to the second level, the selection device 415-*a* may be activated and the selection device 410-*a* and the selection device 420-*a* may be deactivated, thus coupling the word line 430-*a* with the source of the selection device 415-*a*. Moreover, when the phase line 440-*a* is driven to the first level, the selection device 417-*a* may be deactivated thus decoupling the global row line 425 from the word line 430-*a*. Thus the timing scheme described with reference to FIG. 4B may provide a strong enough drive for the desired slew rate of the word line 430-*a*, while preventing overdrive that may otherwise cause the selection devices 420 to break down over time.

Figure 5A:
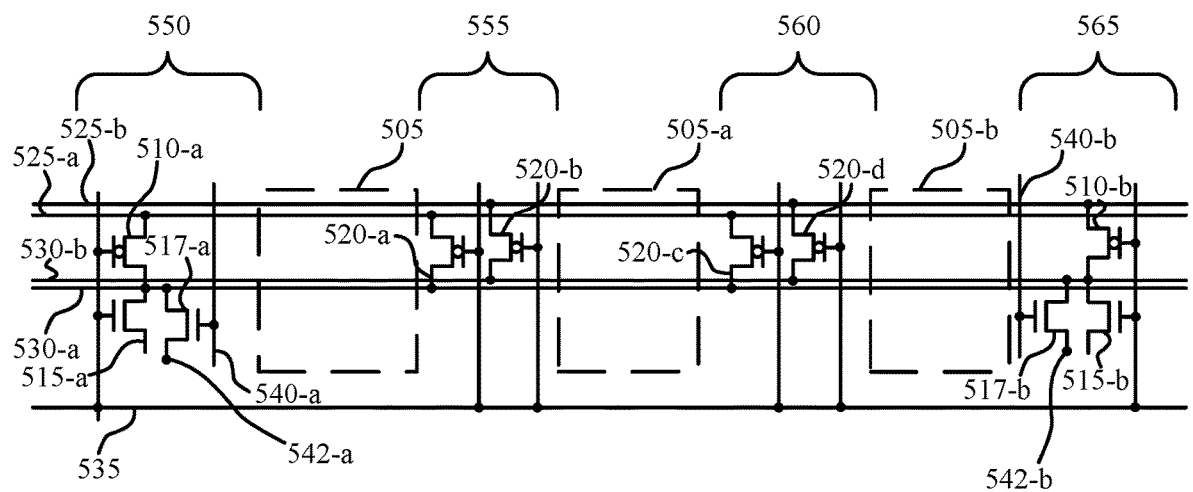
FIGS. 5A and 5B illustrate an example of a circuit diagram and corresponding timing diagram that support a sub word driver in accordance with examples as disclosed herein. line

FIG. 5A illustrates an example of a circuit diagram 500-*a* that supports a sub word line driver in accordance with examples as disclosed herein. The circuit diagram 500-*a* may illustrate an example of one or more drivers (or one or more aspects of one or more drivers) that may be operated to drive a particular word line (e.g., a word line 530). The circuit diagram 500-*a* may illustrate an array of memory cells that is arranged in a plurality of sub-arrays 505. One or more word lines 530 may pass over the sub-arrays, and additional drivers may be located within the gaps between each sub-array 505. For example, a main SWD gap 550 may include a driver for driving a word line 530 using a phase line (PH) 525, a global row bar line (GRF) 535, and a phase bar line 540. The phase line 525 may run horizontally across the memory array, while the global row bar line 535 and/or the phase bar line 540-*a* may either run horizontally across the array or vertically in each SWD gap.

In some examples, the main gap and subsequent SWD gaps may include additional word line drivers for driving each word line. Additionally or alternatively, gaps subsequent to the main gap (e.g., each SWD gap) may include single transistor drivers, which may reduce the spacing between each sub-array 505. Moreover, drivers may drive the selection transistors in each gap to a level that provides a strong enough drive for the desired slew rate of the corresponding word line, while preventing overdrive that may otherwise cause the selection transistor to break down over time.

As described herein, the main SWD gap 550 illustrated in FIG. 5A may be located on a first side of the first sub-array 505. The main SWD gap 550 may include a first selection device 510-a (e.g., a first transistor) of a first type. In some examples, the first selection device 510-a may be a p-type (e.g., a PMOS) transistor. A source of the first selection device 510-a may be coupled with a fourth access line 525-a and a drain of the first selection device 510-a may be coupled with a second access line 530-a. The fourth access line 525-a may be a phase line and the second access line 530-a may be a word line. In some examples, the first selection device 510-a may couple the phase line 525-a with the word line 530-a based on a fifth access line 535. For example, the fifth access line 535 may be a global row bar line 535 that is coupled with the gate of the first selection device 510-a. Thus the first selection device 510-a may couple the phase line 525-a with the word line 530-a based on a relatively low (or negative) voltage (e.g., VNWL) being applied to the global row bar line 535. For example, the voltage (e.g., VNWL) may be the N-well voltage for the memory array, and may be ground or may be a voltage other than ground (e.g., negative voltage).

In some examples, the main SWD gap 550 may include a second selection device 515-a of the second type. In some examples, the second selection device 515-a may be an n-type (e.g., an NMOS) transistor. A source of the second selection device 515-a may be coupled with a voltage source (e.g., VNWL) and a drain of the second selection device 515-a may be coupled with the word line 530-a. In some examples, the second selection device 515-a may couple the word line 530-a with the voltage source (e.g., VNWL) based on a relatively high voltage (e.g., VCCP) being applied to the global row bar line 535. Additionally or alternatively, the main SWD gap 550 may include one or more additional second selection devices associated with additional word lines 330 (e.g., having respective source terminals coupled with VNWL, respective gates coupled with the global row bar line 535, and respective drains coupled with respective word lines 330).

In some examples, the main SWD gap 550 may include a third selection device 517-a of a second type. In some examples, the third selection device 517-a may be an n-type (e.g., an NMOS) transistor. In a first configuration of the third selection device 517-a, a drain of the third selection device 517-a may be coupled with the word line 530-a, and a source 542-a of the third selection device 517-a may be coupled with a voltage source. The gate of the third selection device 517-a may be coupled with the phase bar line 540-a. In some examples, the third selection device 517-a may couple the word line 530-a with the voltage source (e.g., VNWL) based on a relatively high voltage (e.g., VCCP) being applied to the phase bar line 540-a. In a second configuration of the third selection device 517-a, it may have its drain coupled with the word line 530-a, its source 542-a coupled with a different word line 530 (e.g., word line 530-b), and its gate coupled with a global row bar line (e.g., global row bar line 535) such that when the global row bar line is high, the third selection device 517-a may act as a separate path or alternate path or pull-down device for word line 530-a. In yet a third alternative configuration for the third selection device 517-a (not shown), it may have its drain coupled with the word line 530-a, its source 542-a coupled with the phase line 525-a, and its gate coupled with a global row line. For example, the third selection device 517-a may be an n-type (e.g., an NMOS) transistor and thus may have a relatively higher carrier mobility. Moreover, when a signal of the global row bar line 535 goes low and the phase line 525 is less than a threshold above VNWL, the first selection device 510-a may be in a sub-threshold and may not conduct well. Accordingly, the third selection device 517-a may help drive the word line 530-a during this duration (e.g., during an early portion of when the phase line 525 transitions from VNWL to VCCP). In some cases, multiple of these configurations for the third selection device 517-a may be used together (e.g., using additional selection devices).

The word line driver in the main SWD gap 550 (that includes the selection device 510-a, the selection device 515-a, and the selection device 517-a) may be repeated for additional word lines of a group of word lines that is associated with a global row line and global row bar line.

The circuit diagram 500-a may illustrate additional gaps (e.g., SWD gaps) that are located between each of the sub-arrays 505. For example, a first SWD gap 555 may be located on a second side of the first sub-array 505 (and on a first side of a second sub-array 505-a). Because each word line 530 that extends through the memory array may have substantial capacitance and resistance, additional word line drivers may be fabricated in each SWD gap. In some examples, the additional word line drivers may be configured to drive a subset of a total quantity of word lines 530. For example, in some SWD gaps (e.g., "even" SWD gaps) the local driver may be configured to drive even word lines 530 (e.g., a second word line 530, a fourth word line 530, etc.). In other examples, in some SWD gaps (e.g., "odd" SWD gaps) the local driver may be configured to drive odd word lines 530 (e.g., a first word line 530, a third word line 530, etc.). In such a configuration, the main SWD gap may be configured to drive the even word lines 530, and the circuit diagram 500-a may include a second main SWD gap 565 located at the opposite end of the array that includes a selection device 517-b configured to couple the word line 530-b with a voltage source based on a phase bar line 540-b, and selection devices 510-b and 515-b which may couple the word line 530-b with the phase line 525-b or a voltage source based on a global row bar line 535.

As shown in FIG. 5A, the word line driver located in the first SWD gap 555 may include a second selection device 520-a (e.g., a second transistor) of the first type. The word line driver that includes the second selection device may receive substantially the same signals that are used to control the drivers in the main SWD gap 550. However, the presence of the driver in the first SWD gap 555 (and subsequent SWD gaps) may provide a strong enough drive for the desired slew rate of the corresponding word line, while preventing overdrive that may otherwise cause the selection transistor to break down over time. For example, the SWD gap 555 may include a selection device 520-b configured to couple the phase line 525-b with the word line 530-b, the SWD gap 560 may include a selection device 520-d to couple the phase line 525-b with the word line 530-b. The additional word line drivers may be driven by additional global row bar lines, such as GRF0, GRF1, etc., and additional phase lines, such as PH0, PH1, etc.

In some examples, the second selection device 520-*a* may be a p-type (e.g., a PMOS) transistor. A source of the second selection device 520-*a* may be coupled with the phase line 525-*a* and a drain of the second selection device 520-*a* may be coupled with the word line 530-*a*. In some examples, the second selection device 520-*a* may couple the phase line 525-*a* with the word line 530-*a* based on a signal applied to the global row bar line 535. For example, the second selection device 520-*a* may couple the phase line 525 with the word line 530-*a* based on a relatively low voltage (e.g., VNWL or VNWL_DEEP) being applied to the global row bar line 535. As described herein, in some examples, the global row bar line 535 may be driven, for a duration, to VNWL_DEEP in order to more strongly activate the selection device 510-*a* and the selection device 520-*a*. In some examples, VNWL_DEEP may be a voltage that is lower than VNWL.

The first SWD gap 555 may include a plurality of additional transistors that are configured to couple respective local word lines to respective phase lines 525. For example, as described with reference to FIG. 3A, each word line of a group of word lines may be coupled with a respective phase line 525 via a respective selection device located in one or more SWD gaps. Thus each SWD gap may include a plurality of transistors that are each associated with a respective word line and are configured to couple the respective word lines with respective phase lines 525.

In some examples, the global row bar line 535 may be common to a group of word lines that includes the word lines 530-*a* and 530-*b* (and other word lines that are not shown). As described herein, a memory address may be decoded to a word line using a two-step decoding, thus the phase line 525 may be associated with a timing of an access operation. For example, a signal may be asserted to the global row bar line 535 (e.g., asserted to a gate of the selection devices 520) to couple a phase line 525-*a* to the word line 530-*a* before the phase line 525-*a* is activated (e.g., to VCCP). Accordingly, when the phase line 525-*a* is driven to a relatively high voltage, the selected word line 530-*a* will also be driven to the same voltage (e.g., to VCCP).

The circuit diagram 500-*a* may illustrate additional SWD gaps that are located between each of the sub-arrays 505. For example, the circuit diagram 500-*a* may illustrate a second SWD 560 gap that includes a selection device 520-*c* and a selection device 520-*d*. Each SWD gap may include additional transistors coupled with respective word lines and phase lines. Each selection device may couple a respective phase line 525 with a respective word line 530 based on the global row bar line 535 being driven to a relatively low voltage (e.g., VNWL or VNWL_DEEP). As discussed herein, the presence of the drivers in each SWD gap may provide a strong enough drive for the desired slew rate of the corresponding word line, while preventing overdrive that may otherwise cause the selection transistor to break down over time.

Figure 5B:
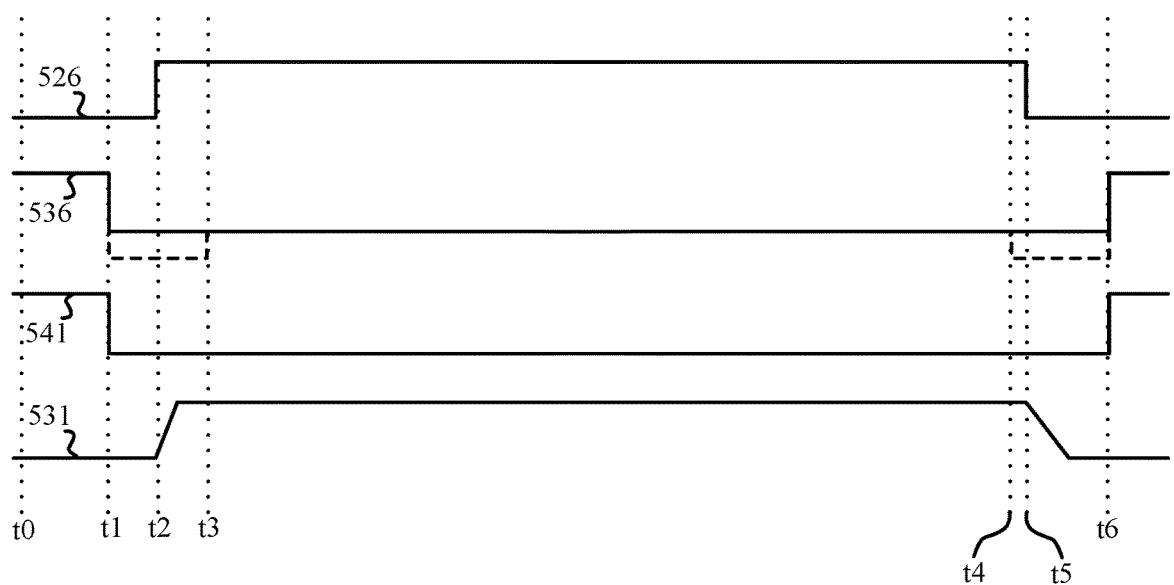

FIG. 5B illustrates an example of a timing diagram 500-*b* that supports a sub word line driver in accordance with examples as disclosed herein. The timing diagram 500-*b* may illustrate the timing associated with operating aspects of the circuit diagram 500-*a* as described with reference to FIG. 5A. For example, the timing diagram 500-*b* may illustrate the timing of signals applied to a phase line 525-*a*, a phase bar line 540-*a*, and a global row bar line 535 as described with reference to FIG. 5A. For example, a signal 526 may be applied to the phase line 525-*a*, a signal 536 may be applied to the global row bar line 535, a signal 541 may be applied to the phase bar line 540-*a*, and a signal 531 may illustrate the corresponding signal on the word line 530-*a*. The signal applied to each of the lines may activate or deactivate particular selection transistors to a level that provides a strong enough drive for the desired slew rate of the word line 530-*a*, while preventing overdrive that may otherwise cause the selection transistor to break down over time.

At t0, the phase line 525-*a* may be maintained at a first level (e.g., VNWL). In some examples, VNWL may be a relatively low (or negative) voltage level. At t0, the phase bar line 540-*a* and the global row bar line 535 may be maintained at a second level (e.g., VCCP). In some examples, the phase bar line 540-*a* and the global row bar line 535 may be driven (e.g., actively driven) to the second level, and the second level may be a higher level than the first level (e.g., VCCP may be higher than VNWL). When the global row bar line 535 is maintained at (or driven to) the second level, the selection device 515-*a* may be activated thus coupling the word line 530-*a* with the voltage source (VNWL) via the selection device 515-*a*. Additionally or alternatively, when the global row bar line 535 is maintained at (or driven to) the second level, the selection device 510-*a* and the selection devices 520 may each be deactivated, while the selection device 515-*a* is activated. Thus, at t0 the phase line 525-*a* may not be coupled with the word line 530-*a*.

At t1, the global row bar line 535 may be driven to a fourth level (e.g., to VNWL_DEEP). In some examples, the global row bar line 535 may be driven (e.g., actively driven) to VNWL_DEEP. Driving the global row bar line 535 to VNWL_DEEP may ensure that the selection device 510-*a* and the selection device(s) 520-*a* are activated. As discussed herein, VNWL_DEEP may be a relatively low voltage that activates the selection device 510-*a* and the selection devices 520-*a* and 520-*c* more strongly than if, for example, VNWL was applied. By applying VNWL_DEEP, and activating the selection device 510-*a* and the selection devices 520-*a* and 520-*c* more strongly, the voltage of the word line 530-*a* may increase from VNWL to VCCP more rapidly.

Additionally or alternatively, the phase bar line 540-*a* may transition to the first level (e.g., VNWL). In some examples, the phase bar line 540-*a* may be driven (e.g., actively driven) to VNWL. At t1, the phase line 525-*a* may be maintained at the first level (e.g., at VNWL). When the global row bar line 535 is driven to the fourth level, the selection device 510-*a* and the selection devices 520 may be activated, and the selection device 515-*a* may be deactivated, thus coupling the phase line 525-*a* with the word line 530-*a*. Moreover, when the phase bar line 540-*a* is driven to the first level, the selection device 517-*a* may be deactivated. Alternatively, if the selection device has its source coupled with the phase line 525-*a*, its drain coupled with the word line 530-*a*, and its gate coupled with the global row line, it may also be activated at t1 when the global row bar line 535 is driven to the fourth level and the global row line is driven to the second level or to a third level higher than the second level (e.g., VCCP2).

At t2, the phase line 525-*a* may be driven to the second level (e.g., to VCCP), and the global row bar line 535 and the phase bar line 540-*a* may be maintained at the same levels. Because the phase line 525-*a* may be coupled with the word line 530-*a* (e.g., based on the signaling at t1), the word line 530-*a* may begin to transition to the second level (e.g., to VCCP). In particular, the rate at which the word line 530-*a* transitions to VCCP may be increased due to the relatively low voltage (e.g., VNWL_DEEP) being applied to the global row bar line 535. Thus by applying VNWL_DEEP, the selection device 510-*a* and the selection devices 520 may be more-strongly activated than if applying VNWL. That is, applying VNWL_DEEP to the global row bar line 535 may activate the selection device 510-*a* and the selection devices 520 more strongly than if VNWL was applied, which may allow the word line 530-*a* to reach VCCP faster. Thus, at a duration after t2 (and before t3), the word line 530-*a* may reach VCCP.

At t3, the global row bar line 535 may be driven to the first level (e.g., VNWL) and the phase line 525-*a*, the word line 530-*a*, and the phase bar line 540-*a* may be maintained at the same levels. For example, the global row bar line 535 may be driven to VNWL after the word line 530-*a* reaches VCCP. Driving the global row bar line 535 to the first level may not deactivate the selection device 510-*a* or the selection devices 520. Instead, the selection device 510-*a* and the selection devices 520 may remain activated and the word line 530-*a* may be maintained at the second level (e.g., at VCCP). By driving the global row bar line 535 to VNWL (e.g., after driving it to VNWL_DEEP for a duration), less stress may be placed on the selection device 510-*a* and the selection devices 520. Accordingly, driving the global row bar line 535 to VNWL after driving it to VNWL_DEEP may provide a strong enough drive for the desired slew rate of the word line 530-*a* without overstressing the selection devices.

At t4, the global row bar line 535 may be driven to the fourth level (e.g., to VNWL_DEEP), and the phase line 525-*a* and the phase bar line 540-*a* may be maintained at the same levels. In some examples, the global row bar line 535 may not be driven to the fourth level for a second time, and instead may be driven to the first level (e.g., to VNWL) for an extended duration (e.g., until t6).

At t5, the phase line 525-*a* may be driven to the first level (e.g., to VNWL), and the global row bar line 535 and the phase bar line 540-*a* may be maintained at the same levels. Because the phase line 525-*a* may be coupled with the word line 530-*a* (e.g., based on the selection device 510-*a* and the selection devices 520), the word line 530-*a* may begin to transition downward to the first level (e.g., to VNWL). Thus, at a duration after t5 (and before t6), the word line 530-*a* may reach VNWL.

At t6, the global row bar line 535 may transition to the second level (e.g., to VCCP). In some examples, the global row bar line 535 may be driven (e.g., actively driven) to VCCP. Additionally or alternatively, the phase bar line 540-*a* may transition to the first level (e.g., VNWL). In some examples, the phase bar line 540-*a* may be driven (e.g., actively driven) to VNWL. At t6, the phase line 525-*a* may be maintained at the first level (e.g., at VNWL). When the global row bar line 535 is driven to the second level, the selection device 515-*a* may be activated and the selection device 510-*a* and the selection device(s) 520-*a* may be deactivated, thus coupling the word line 530-*a* with the source of the selection device 515-*a* (e.g., VNWL). Moreover, when the phase bar line 540-*a* is driven to the first level, the selection device 517-*a* may be activated. Alternatively, if selection device 517-*a* has its drain coupled with the word line 530-*a*, its source 542-*a* coupled with a different word line 530 (e.g., word line 530-*b*), and its gate coupled with a global row bar line (e.g., the second configuration), it may provide an additional path to VNWL through the other word line when the global row bar line is asserted (e.g., driven to the second level). Yet alternatively, if the selection device 517-*a* has its source coupled with the phase line 525, its drain coupled with the word line 530-*a*, and its gate coupled with the global row line (e.g., the third configuration), it may also be deactivated at t6 when the global row line is driven to the first level (e.g., VNWL). Thus the timing scheme described with reference to FIG. 5B may provide a strong enough drive for the desired slew rate of the word line 530-*a*, while preventing overdrive that may otherwise cause the selection devices 510-*a* and 520 to break down over time.

Figure 6A:
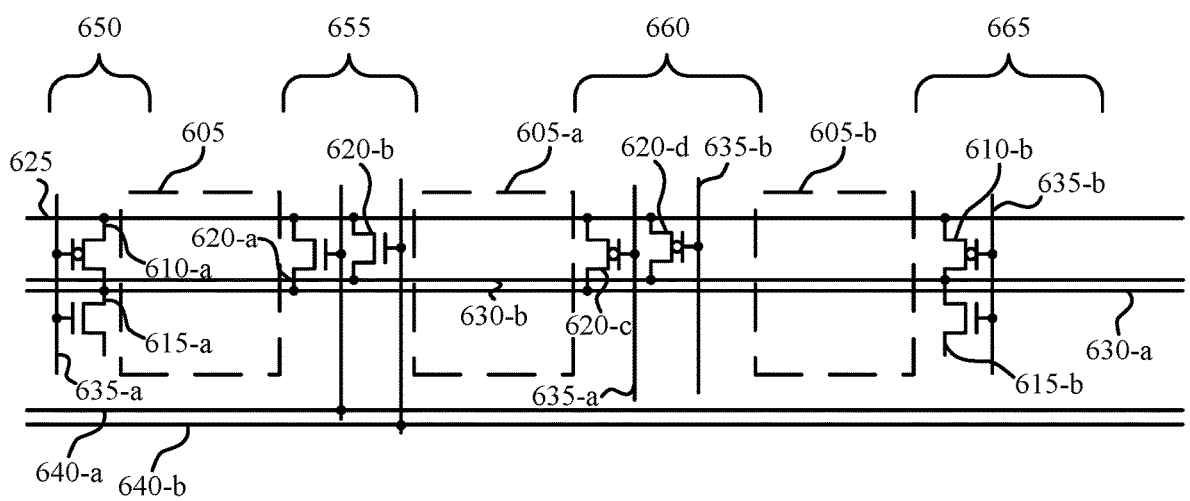
FIGS. 6A and 6B illustrate an example of a circuit diagram and corresponding timing diagram that support a sub word line driver in accordance with examples as disclosed herein.

FIG. 6A illustrates an example of a circuit diagram 600-*a* that supports a sub word line driver in accordance with examples as disclosed herein. The circuit diagram 600-*a* may illustrate an example of one or more drivers (or one or more aspects of one or more drivers) that may be operated to drive a particular word line (e.g., a word line 330-*a* or a word line 330-*b*). The circuit diagram 600-*a* may illustrate an array of memory cells that is arranged in a plurality of sub-arrays 605. One or more word lines 630 may pass over the sub-arrays, and additional drivers may be located within the gaps between each sub-array 605. For example, a main gap (e.g., a main SWD gap 650) may include a driver for driving a word line 630 using a global word line (GR) 625, a phase line (PH) 640, and a phase bar line (PHF) 635. In some examples, the main gap may also include additional word line drivers for driving additional word lines. Additionally or alternatively, gaps subsequent to the main gap (e.g., each SWD gap) may include single transistor drivers, which may reduce the spacing between each sub-array 605. Moreover, drivers may drive the selection transistors in each gap to a level that provides a strong enough drive for the desired slew rate of the corresponding word line, while preventing overdrive that may otherwise cause the selection transistor to break down over time.

As described herein, the main SWD gap 650 illustrated in FIG. 6A may be located on a first side of the first sub-array 605. The main SWD gap 650 may include a first selection device 610-*a* (e.g., a first transistor) of a first type. In some examples, the first selection device 610-*a* may be a p-type (e.g., a PMOS) transistor. A source of the first selection device 610-*a* may be coupled with a first access line 625 and a drain of the first selection device 610-*a* may be coupled with a second access line 630-*a*. The first access line 625 may be a global row line and the second access line 630-*a* may be a word line. In some examples, the first selection device 610-*a* may couple the global row line 625 with the word line 630-*a* based on a third access line 635-*a*. For example, the third access line 635-*a* may be a phase bar line 635-*a* that is coupled with the gate of the first selection device 610-*a*. Thus the first selection device 610-*a* may couple the global row line 625 with the word line 630-*a* based on a relatively low (or negative) voltage (e.g., VNWL) being applied to the phase bar line 635-*a*. For example, the voltage (e.g., VNWL) may be the N-well voltage for the memory array, and may be ground or may be a voltage other than ground (e.g., negative voltage).

In some examples, the main SWD gap 650 may include an additional selection device 615-*a* of a second type. In some examples, the selection device 615-*a* may be an n-type (e.g., an NMOS) transistor. A source of the selection device 615-*a* may be coupled with a voltage source (e.g., VNWL) and a drain of the selection device 615-*a* may be coupled with the word line 630-*a*. In some examples, the selection device 615-*a* may couple the word line 630-*a* with the voltage source (e.g., VNWL) based on a relatively high voltage (e.g., VCCP) being applied to the phase bar line 635-*a*. Additionally or alternatively, the main SWD gap 650 may include one or more selection devices associated with additional word lines. For example, the word line driver in the main SWD gap 650 (that includes the selection device 610-*a* and the selection device 615-*a*) may be repeated for additional word lines extending across the memory array. The additional word line drivers may be driven by global row lines and additional phase bar lines. For example, the additional word line drivers may be driven by additional global row lines GR and additional phase bar lines, such as PHF0, PHF1, etc.

The circuit diagram 600-*a* may be an example of a "hybrid" version of the circuit diagram illustrated in FIG. 3A. That is, the SWD gaps (e.g., a first SWD gap 655, a second SWD gap 660, a third SWD gap, a fourth SWD gap, etc.) subsequent to the main SWD gap 650 may have different (e.g., alternating each gap or alternating over more than one gap) transistor types. For example, a first SWD gap 655 may be located on a second side of the first sub-array 605 (and on a first side of a second sub-array 605-*a*). The word line driver located in the first SWD gap 655 may include a second selection device 620-*a* (e.g., a second transistor) of the second type. In some examples, the second selection device 620-*a* may be an n-type (e.g., an NMOS) transistor. A source of the second selection device 620-*a* may be coupled with the word line 630-*a* and a drain of the second selection device 620-*a* may be coupled with the global row line 625.

In some examples, the second selection device 620-*a* may couple the global row line 625 with the word line 630-*a* based on a fourth access line 640-*a*. For example, the fourth access line 640-*a* may be a phase line 640-*a* that is coupled with the gate of the second selection device 620-*a*. Thus the second selection device 620-*a* may couple the global row line 625 with the word line 630-*a* based on a relatively high voltage (e.g., VCCP or VCCP2) being applied to the phase line 640-*a*. In some examples, the phase line 640-*a* may run vertically in the memory array through a subset of SWD gaps, and may thus not run across the array. By running the phase lines vertically through the SWD gaps, there may be more area available for the word lines. Moreover, the SWD gap 655 may include a selection device for each additional word line 630-*a*. For example, the selection device 620-*b* may couple the global row line 625 with a word line 630-*b* based on a phase line 640-*b*.

Additionally or alternatively, the word line driver located in the second SWD gap 660 may include a fourth selection device 620-*c* (e.g., a fourth transistor) of the first type. In some examples, the fourth selection device 620-*c* may be a p-type (e.g., a PMOS) transistor. A drain of the fourth selection device 620-*c* may be coupled with the word line 630-*a* and a source of the fourth selection device 620-*c* may be coupled with the global row line 625. In some examples, the fourth selection device 620-*c* may couple the global row line 625 with the word line 630-*a* based on the third access line 635-*a*. For example, the third access line 635-*a* may be a phase bar line 635-*a* that is coupled with the gate of the fourth selection device 620-*b*. Thus the fourth selection device 620-*b* may couple the global row line 625 with the word line 630-*a* based on a relatively low voltage (e.g., VNWL) being applied to the phase line 640-*a*.

Moreover, the SWD gap 660 may include a selection device for each additional word line 630. For example, the selection device 620-*d* may couple the global row line 625 with a word line 630-*b* based on a phase bar line 635-*b*. In some examples, the phase lines 640 and phase bar lines 635 may run vertically in the memory array through a subset of SWD gaps, and may thus not run across the array. By running the phase lines and phase bar lines vertically through the SWD gaps, there may be more area available over the memory array for the word lines.

As described herein, subsequent SWD gaps may include a pattern of (e.g., alternating) transistor types such that each subset of transistors is configured to be activated (or deactivated) based on the phase bar line 635 or the phase line 640. Each SWD gap may include a plurality of transistors (of the same type as the other transistors in the same gap) that each correspond to a word line of a set of word lines. Each set of word lines may correspond to a global row line 625. In such a configuration, the main SWD gap may be configured to drive the even word lines 630, and the circuit diagram 600-*a* may include a second main SWD gap 665 located at the opposite end of the array that includes a selection device 610-*b* and a selection device 615-*b* that are coupled with a phase bar line 635-*b* and configured to drive the odd word lines 630, such as the word line 630-*b*.

Although illustrated as alternating transistor types for each SWD gap, other patterns may be used including a pattern of one or more SWD gaps having transistors of the first type followed by one or more SWD gaps having transistors of the second type, with the pattern repeated. Alternatively, the pattern may not be repeating, and may have a first quantity of SWD gaps with transistors of the first type and a second quantity of SWD gaps having transistors of the second type. The presence of the drivers in each SWD gap may provide a strong enough drive for the desired slew rate of the corresponding word line, while preventing overdrive that may otherwise cause the selection transistor to break down over time.

Figure 6B:
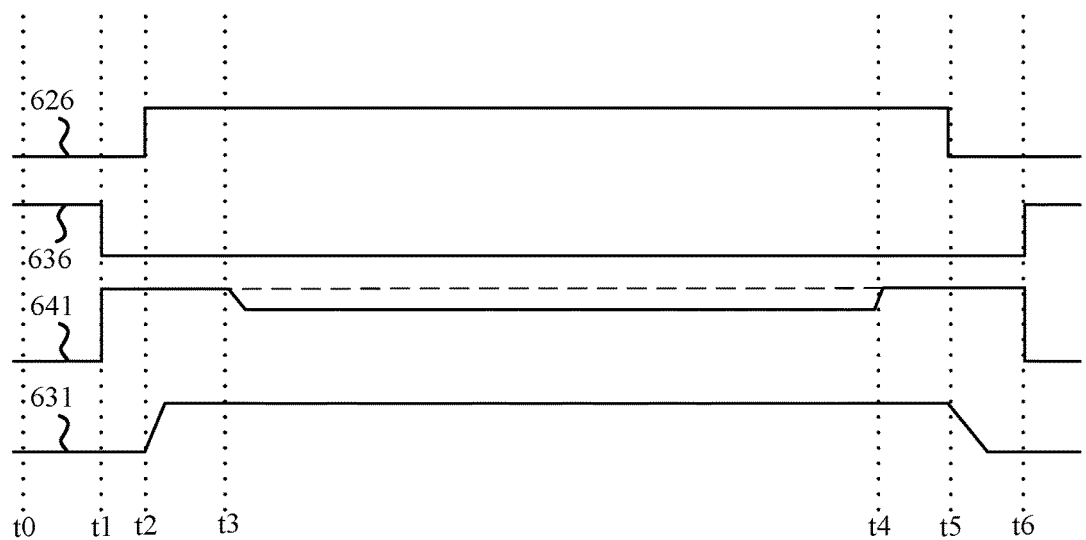

FIG. 6B illustrates an example of a timing diagram 600-*b* that supports a sub word line driver in accordance with examples as disclosed herein. The timing diagram 600-*b* may illustrate the timing associated with operating aspects of the circuit diagram 600-*a* as described with reference to FIG. 6A. For example, the timing diagram 600-*b* may illustrate the timing of signals applied to a global row line 625, a phase bar line 635-*a*, a phase line 640-*a*, and a word line 630-*a* as described with reference to FIG. 6A. For example, a signal 626 may be applied to the global row line 625, a signal 636 may be applied to the phase bar line 635-*a*, a signal 641 may be applied to the phase line 640-*a*, and a signal 631 may be applied to the word line 630-*a*. The signal applied to each of the lines may activate or deactivate particular selection transistors to a level that provides a strong enough drive for the desired slew rate of the word line 630-*a*, while preventing overdrive that may otherwise cause the selection transistor to break down over time.

At t0, the first access line 625 (e.g., the global row line 625) and the fourth access line 640-*a* (e.g., the phase line 640-*a*) may each be maintained at a first level (e.g., VNWL). In some examples, VNWL may be a relatively low (or negative) voltage level. At t0, the third access line 635-*a* (e.g., the phase bar line 635-*a*) may be maintained at a second level (e.g., VCCP). In some examples, the third access line 635-*a* may be driven (e.g., actively driven) to the second level, and the second level may be a higher level than the first level (e.g., VCCP may be higher than VNWL). When the phase bar line 635-*a* is maintained at (or driven to) the second level, the selection device 615-*a* may be activated thus coupling the word line 630-*a* with the voltage source (e.g., VNWL). Additionally or alternatively, when the phase bar line 635-*a* is maintained at (or driven to) the second level and the phase line 640-*a* is maintained at the first level, the selection device 610-*a* (and any selection devices located in the SWD gaps) may be deactivated. Thus, at t0 the global row line 625 may not be coupled with the word line 630-*a*.

At t1, the phase bar line 635-*a* may transition to the first level (e.g., to VNWL). In some examples, the phase bar line 635-*a* may be driven (e.g., actively driven) to VNWL. Additionally or alternatively, the phase line 640-*a* may transition to a third level (e.g., VCCP2), which may be higher than the second level (e.g., VCCP2 may be higher than VCCP). In some examples, the phase line 640-*a* may be driven (e.g., actively driven) to VCCP2. At t1, the global row line 625 may be maintained at the first level (e.g., at VNWL). As described herein, the global row line 625 may be driven (e.g., actively driven) to the first level. Thus, at t1, the word line 630-*a* may remain at the first level (e.g., at VNWL).

In some examples (not shown), the phase bar line 635-*a* may be driven to a fourth level (e.g., to VNWL_DEEP) as described with reference to FIG. 4A. For example, the phase bar line 635-*a* may be driven (e.g., actively driven) to VNWL_DEEP. Driving the phase bar line 635-*a* to VNWL_DEEP may ensure that the selection device 610-*a* and the selection devices 620-*c* and 620-*d* are activated with sufficient drive strength. As discussed herein, VNWL_DEEP may be a relatively low voltage that activates the selection devices 610-*a* and 620-*c* more strongly than if, for example, VNWL was applied. By applying VNWL_DEEP, and activating the selection devices 610-*a* and 620-*c* more strongly, the voltage of the word line 630-*a* may increase from VNWL to VCCP more rapidly.

When the phase bar line 635-*a* is driven to the first level or the fourth level, the selection device 615-*a* may be deactivated and the selection devices 610-*a*, 620-*c* (and any other PMOS selection devices 620 located in the SWD gaps) may be activated, thus coupling the global row line 625 with the word line 630-*a*. Moreover, when the phase line 340 is driven to the third level, the selection devices 620-*a* (and any other NMOS selection devices located in the SWD gaps) may be activated thus coupling the global row line 625 with the word line 630-*a*.

At t2, the global row line 625 may be driven to the second level (e.g., to VCCP), and the phase bar line 635-*a* and the phase line 640-*a* may be maintained at the same levels. Because the global row line 625 may be coupled with the word line 630-*a* (e.g., based on the signaling at t1), the word line 630-*a* may begin to transition to the second level (e.g., to VCCP). Thus, at a duration after t2 (and before t3), the word line 630-*a* may reach VCCP.

At t3, the phase line 640-*a* may be driven to the second level (e.g., to VCCP), and the global row line 625 may be maintained at the same level. If the phase bar line 635-*a* was driven to the fourth level at t1, it may be driven to the first level at t3. If the phase bar line 635-*a* was driven to the first level at t1, it may be maintained at the first level at t3. The second level (e.g., VCCP) may be a threshold voltage of the selection device 620-*a* lower than the third level (e.g., VCCP2). Thus, driving the phase line 640-*a* to the second level may not deactivate the selection device 620-*a* (or any other NMOS selection devices located in the SWD gaps). Instead, the selection device 620-*a* may remain activated and the word line 630-*a* may be maintained at the second level (e.g., at VCCP). For example, driving the gate of the selection device 620-*a* to VCCP2 may ensure that the entire transition of the word line 630-*a* occurs with the selection device 620-*a* not in cut-off or sub-threshold, and thus may be actively driven using the selection device 620-*a*. If VCCP was used on the gate of the selection device 620-*a* during the transition of the word line 630-*a*, the selection device 620-*a* may provide good drive strength for the word line 630-*a* until the word line 630-*a* reaches a threshold below VCCP. At this time (e.g., when the word line 630-*a* reaches a threshold below VCCP), the selection device 620-*a* may begin to operate in sub-threshold or cut-off regions, where its strength is much lower. Therefore, the word line 630-*a* would effectively be driven to VCCP by the PMOS selection devices 610-*a* and 620-*c*. Moreover, once the word line 630-*a* reaches VCCP, reducing the gate voltage on the selection device 620-*a* may also effectively put it in sub-threshold or cut-off. However, since the word line 630-*a* is already driven (e.g., to VCCP), less drive is required to maintain the word line 630-*a* at VCCP, thus mitigating any effects resulting from the word line 630-*a* being driven only by the PMOS selection devices 610-*a* and 620-*c*. Accordingly, driving the phase line 640-*a* to VCCP may prevent overdrive on the selection device 620-*a* that would otherwise cause the selection device 620-*a* to break down over time.

At t4, the phase line 640-*a* may be driven to the third level (e.g., to VCCP2) and the global row line 625 may be maintained at the same level. In some examples, the phase line 640-*a* may not be driven to the third level for a second time, and instead may be driven to the second level (e.g., VCCP) for an extended duration (e.g., until t6). In some examples, the phase bar line 635-*a* may be driven to the fourth level (not shown) at t4. Alternatively, the phase bar line 635-*a* may be maintained at the first level at t4.

At t5, the global row line 625 may be driven to the first level (e.g., to VNWL), and the phase bar line 635-*a* and the phase line 640-*a* may be maintained at the same levels. Because the global row line 625 may be coupled with the word line 630-*a* (e.g., based on the levels of the phase line 640-*a* and phase bar line 635-*a*), the word line 630-*a* may begin to transition downward to the first level (e.g., to VNWL). Thus, at a duration after t5 (and before t6), the word line 630-*a* may reach VNWL.

At t6, the phase bar line 635-*a* may transition to the second level (e.g., to VCCP). In some examples, the phase bar line 635-*a* may be driven (e.g., actively driven) to VCCP. The phase line 640-*a* may transition to the first level (e.g., VNWL) at t6. In some examples, the phase line 640-*a* may be driven (e.g., actively driven) to VNWL. At t6, the global row line 625 may be maintained at the first level (e.g., at VNWL).

When the phase bar line 635-*a* is driven to the second level, the selection device 615-*a* may be activated and the selection device 610-*a* (and any other PMOS selection devices located in the SWD gaps) may be deactivated, thus coupling the word line 630-*a* with the voltage source (e.g., with VNWL). Moreover, when the phase line 640-*a* is driven to the first level, the selection device 620-*a* may be deactivated thus decoupling the global row line 625 from the word line 630-*a*. Thus the timing scheme described with reference to FIG. 6B may provide a strong enough drive for the desired slew rate of the word line 630-*a*, while preventing overdrive that may otherwise cause the selection devices 620 to break down over time.

Figure 7:
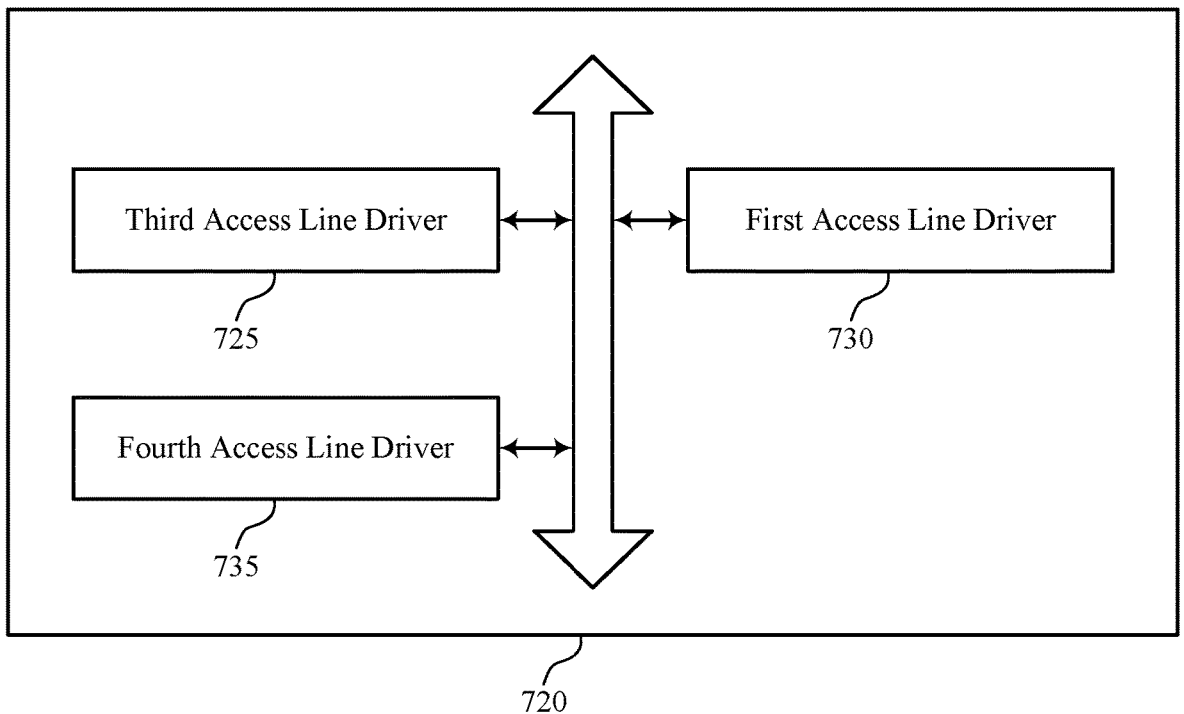
FIG. 7 shows a block diagram of a memory device that supports a sub word line driver in accordance with examples as disclosed herein.

FIG. 7 shows a block diagram 700 of a memory device 720 that supports a sub word line driver in accordance with examples as disclosed herein. The memory device 720 may be an example of aspects of a memory device as described with reference to FIGS. 1 through 6. The memory device 720, or various components thereof, may be an example of means for performing various aspects of sub word line driver as described herein. For example, the memory device 720 may include a third access line driver 725, a first access line driver 730, a fourth access line driver 735, or any combination thereof. Each of these components may communicate, directly or indirectly, with one another (e.g., via one or more buses).

The third access line driver 725 may be configured as or otherwise support a means for driving, at a first time and while a first access line is at a first level, a third access line and a fourth access line to complementary levels, where at least one of the complementary levels is different than the first level and a second level associated with a second access line providing access of a subset of an array of memory cells, and where the first access line is coupled with the second access line via a first selection device of a first type and a second selection device of a second type based at least in part on driving at least one of the third access line and the fourth access line to the complementary levels.

In some examples, the third access line driver 725 may be configured as or otherwise support a means for driving, at a fourth time and while the first access line is at the second level, the third access line and the fourth access line to the complementary levels. In some examples, the third access line driver 725 may be configured as or otherwise support a means for driving, at the first time, the third access line to a third level based at least in part on driving the fourth access line to the first level, where the third level is lower than the first level and the second level.

In some examples, the third access line driver 725 may be configured as or otherwise support a means for driving, at a fifth time, the third access line to the first level after driving the third access line to the third level, where the first level is greater than the third level and less than at least the second level. In some examples, the second selection device is configured to couple the first access line with the second access line based at least in part on the third access line.

The first access line driver 730 may be configured as or otherwise support a means for driving, at a second time, the first access line to the second level.

The fourth access line driver 735 may be configured as or otherwise support a means for driving, at a third time, the third access line to the second level and the fourth access line to the first level based at least in part on driving the first access line to the second level.

Figure 8:
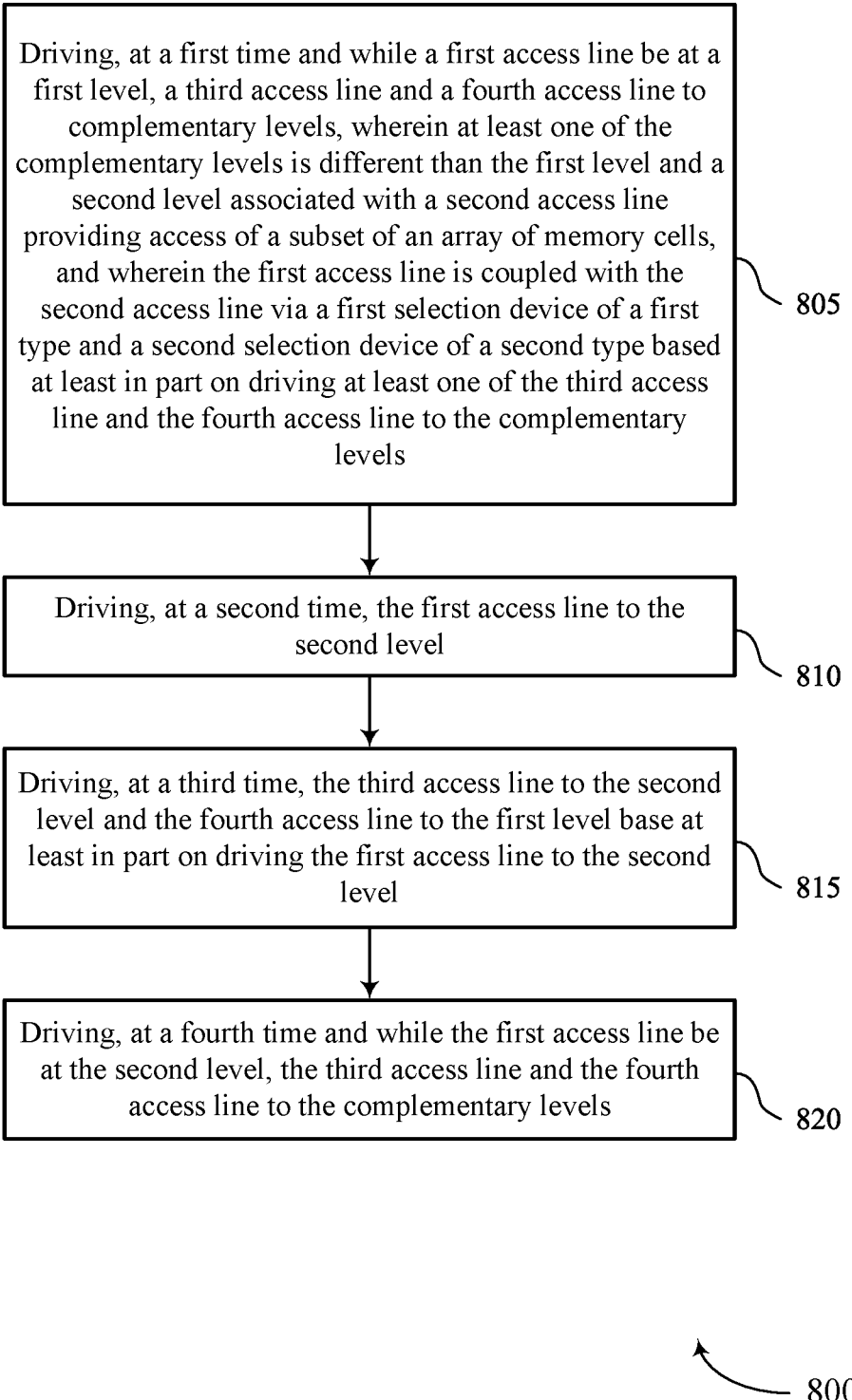
FIG. 8 shows a flowchart illustrating a method or methods that support a sub word line driver in accordance with examples as disclosed herein.

FIG. 8 shows a flowchart illustrating a method 800 that supports a sub word line driver in accordance with examples as disclosed herein. The operations of method 800 may be implemented by a memory device or its components as described herein. For example, the operations of method 800 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 805, the method may include driving, at a first time and while a first access line is at a first level, a third access line and a fourth access line to complementary levels, where at least one of the complementary levels is different than the first level and a second level associated with a second access line providing access of a subset of an array of memory cells, and where the first access line is coupled with the second access line via a first selection device of a first type and a second selection device of a second type based at least in part on driving at least one of the third access line and the fourth access line to the complementary levels. The operations of 805 may be performed in accordance with examples as disclosed herein. In some examples, aspects of the operations of 805 may be performed by a third access line driver 725 as described with reference to FIG. 7.

At 810, the method may include driving, at a second time, the first access line to the second level. The operations of 810 may be performed in accordance with examples as disclosed herein. In some examples, aspects of the operations of 810 may be performed by a first access line driver 730 as described with reference to FIG. 7.

At 815, the method may include driving, at a third time, the third access line to the second level and the fourth access line to the first level based at least in part on driving the first access line to the second level. The operations of 815 may be performed in accordance with examples as disclosed herein. In some examples, aspects of the operations of 815 may be performed by a fourth access line driver 735 as described with reference to FIG. 7.

At 820, the method may include driving, at a fourth time and while the first access line is at the second level, the third access line and the fourth access line to the complementary levels. The operations of 820 may be performed in accordance with examples as disclosed herein. In some examples, aspects of the operations of 820 may be performed by a third access line driver 725 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor) for driving, at a first time and while a first access line is at a first level, a third access line and a fourth access line to complementary levels, where at least one of the complementary levels is different than the first level and a second level associated with a second access line providing access of a subset of an array of memory cells, and where the first access line is coupled with the second access line via a first selection device of a first type and a second selection device of a second type based at least in part on driving at least one of the third access line and the fourth access line to the complementary levels, driving, at a second time, the first access line to the second level, driving, at a third time, the third access line to the second level and the fourth access line to the first level based at least in part on driving the first access line to the second level, and driving, at a fourth time and while the first access line is at the second level, the third access line and the fourth access line to the complementary levels.

In some examples of the method 800 and the apparatus described herein, driving, at the first time, the third access line to a third level based at least in part on driving the fourth access line to the first level, where the third level may be lower than the first level and the second level.

In some examples of the method 800 and the apparatus described herein, driving, at a fifth time, the third access line to the first level after driving the third access line to the third level, where the first level may be greater than the third level and less than at least the second level.

In some examples of the method 800 and the apparatus described herein, the second selection device may be configured to couple the first access line with the second access line based at least in part on the third access line.

It should be noted that the methods described herein describe possible implementations, and that the operations and the steps may be rearranged or otherwise modified and that other implementations are possible. Further, portions from two or more of the methods may be combined.

An apparatus is described. The apparatus may include an array of memory cells arranged in a plurality of sub-arrays that each include a plurality of memory cells, a first selection device of a first type located on a first side of a first sub-array of the plurality of sub-arrays, where the first selection device is configured to couple a first access line with a second access line based at least in part on a third access line, the second access line accessing a subset of the array of memory cells for an access operation upon transitioning from a first level to a second level that is higher than the first level, a second selection device of a second type located on a second side of the first sub-array of the plurality of sub-arrays, where the second selection device is configured to couple the first access line with the second access line based at least in part on a fourth access line and, a controller coupled with the first selection device and the second selection device, the controller configured t0, drive the third access line to the first level and the fourth access line to a third level at a first time, where the third level is higher than the second level, drive the first access line to the second level at a second time, drive the fourth access line to the second level at a third time, and drive the fourth access line to the third level at a fourth time that occurs after the third time and when the first access line is at the second level In some examples, the apparatus may include drive the first access line to the first level at a fifth time that occurs after the fourth time.

In some examples, the apparatus may include a third selection device of the first type located on the second side of a second sub-array of the plurality of sub-arrays, where the third selection device may be configured to couple the first access line with the second access line based at least in part on the third access line.

In some examples, the apparatus may include drive the third access line to a fourth level at the first time.

In some examples of the apparatus, the first access line may be associated with a timing of the access operation.

In some examples, the apparatus may include a plurality of second selection devices of the second type located on the second side of each sub-array of at least a subset of the plurality of sub-arrays.

In some examples of the apparatus, the second level may be a threshold voltage of the second selection device lower than the third level.

In some examples of the apparatus, the first selection device includes a p-channel transistor and the second selection device includes an n-channel transistor.

Another apparatus is described. The apparatus may include an array of memory cells arranged in a plurality of sub-arrays that each include a plurality of memory cells, a first selection device of a first type located on a first side of a first sub-array of the plurality of sub-arrays, where the first selection device is configured to couple a first access line with a second access line based at least in part on a third access line, the second access line accessing a subset of the array of memory cells for an access operation upon transitioning from a first level to a second level higher than the first level, a second selection device of the first type located on a second side of the first sub-array of the plurality of sub-arrays, where the second selection device is configured to couple the first access line with the second access line based at least in part on the third access line, a controller coupled with the first selection device and the second selection device, the controller configured t0, drive the third access line to a third level at a first time, where the third level is lower than the first level and the second level, and drive the first access line to the second level at a second time after the first time In some examples, the apparatus may include drive the third access line to the first level at a third time, where the third time occurs after the second time and while the first access line may be driven to the second level.

In some examples, the apparatus may include drive the third access line to the third level at a fourth time that occurs after the third time and while the first access line may be driven to the second level.

In some examples, the apparatus may include drive the first access line to the first level at a fifth time after the fourth time and drive the third access line to the second level at a sixth time that occurs after the fifth time and while the first access line may be driven to the first level.

In some examples, the apparatus may include a third selection device of a second type located on the first side of the first sub-array of the plurality of sub-arrays, where the third selection device may be configured to pull down the second access line based at least in part on a fourth access line, where the controller may be configured to and drive the fourth access line to the first level at the first time, where at least a portion of the third access line may be inverted relative to the fourth access line.

In some examples of the apparatus, the first access line and the third access line may be each decoded from separate bits of an address.

In some examples of the apparatus, the third access line may be associated with selecting a plurality of word lines of the first sub-array, and the first access line may be associated with selecting a single word line of the plurality of word lines based at least in part on the first access line being driven to the second level.

In some examples of the apparatus, the first selection device and the second selection device each include a p-channel transistor.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited t0, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   an array of memory cells arranged in a plurality of sub-arrays that each comprise a plurality of memory cells;
   a first selection device of a first type located on a first side of a first sub-array of the plurality of sub-arrays, wherein the first selection device is configured to couple a first access line with a second access line based at least in part on a third access line, the second access line accessing a subset of the array of memory cells for an access operation upon transitioning from a first level to a second level that is higher than the first level;
   a second selection device of a second type located on a second side of the first sub-array of the plurality of sub-arrays, wherein the second selection device is configured to couple the first access line with the second access line based at least in part on a fourth access line; and
   a controller coupled with the first selection device and the second selection device, the controller configured to:
   drive the third access line to the first level and the fourth access line to a third level at a first time, wherein the third level is higher than the second level;
   drive the first access line to the second level at a second time;
   drive the fourth access line to the second level at a third time; and
   drive the fourth access line to the third level at a fourth time that occurs after the third time and when the first access line is at the second level.
2. The apparatus of claim 1, wherein the controller is configured to:
   drive the first access line to the first level at a fifth time that occurs after the fourth time.
3. The apparatus of claim 1, further comprising:
   a third selection device of the first type located on the second side of a second sub-array of the plurality of sub-arrays, wherein the third selection device is configured to couple the first access line with the second access line based at least in part on the third access line.
4. The apparatus of claim 3, wherein the controller is configured to:
   drive the third access line to a fourth level at the first time.
5. The apparatus of claim 1, wherein the first access line is associated with a timing of the access operation.
6. The apparatus of claim 1, further comprising:
   a plurality of second selection devices of the second type located on the second side of each sub-array of at least a subset of the plurality of sub-arrays.
7. The apparatus of claim 1, wherein the second level is a threshold voltage of the second selection device lower than the third level.
8. The apparatus of claim 1, wherein the first selection device comprises a p-channel transistor and the second selection device comprises an n-channel transistor.
9. A method, comprising:
   driving, at a first time and while a first access line is at a first level, a third access line and a fourth access line to complementary levels, wherein at least one of the complementary levels is different than the first level and a second level associated with a second access line providing access of a subset of an array of memory cells, and wherein the first access line is coupled with the second access line via a first selection device of a first type and a second selection device of a second type based at least in part on driving at least one of the third access line and the fourth access line to the complementary levels;
   driving, at a second time, the first access line to the second level;
   driving, at a third time, the third access line to the first level and the fourth access line to the second level based at least in part on driving the first access line to the second level; and
   driving, at a fourth time and while the first access line is at the second level, the third access line and the fourth access line to the complementary levels.
10. The method of claim 9, further comprising:
    driving, at the first time, the third access line to a third level based at least in part on driving the fourth access line to the first level, wherein the third level is lower than the first level and the second level.
11. The method of claim 10, further comprising:
    driving, at a fifth time, the third access line to the first level after driving the third access line to the third level, wherein the first level is greater than the third level and less than at least the second level.
12. The method of claim 9, wherein the second selection device is configured to couple the first access line with the second access line based at least in part on the third access line.

* * * * *